US012278226B2

(12) United States Patent
Hong et al.

(10) Patent No.: US 12,278,226 B2
(45) Date of Patent: Apr. 15, 2025

(54) DISPLAY APPARATUS INCLUDING DISPLAY MODULE WITH ANISOTROPIC CONDUCTIVE LAYER, FRONT COVER AND SIDE COVER, AND MANUFACTURING METHOD THEREOF

(71) Applicant: SAMSUNG ELECTRONICS CO., LTD., Suwon-si (KR)

(72) Inventors: Soonmin Hong, Suwon-si (KR); Seonghwan Shin, Suwon-si (KR); Tackmo Lee, Suwon-si (KR); Hyeongik Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 397 days.

(21) Appl. No.: 17/745,458

(22) Filed: May 16, 2022

(65) Prior Publication Data

US 2023/0027649 A1    Jan. 26, 2023

Related U.S. Application Data

(63) Continuation of application No. PCT/KR2022/006347, filed on May 3, 2022.

(30) Foreign Application Priority Data

Jul. 20, 2021   (KR) .................. 10-2021-0094931

(51) Int. Cl.
*H01L 25/16*    (2023.01)
*H01L 25/075*   (2006.01)
(Continued)

(52) U.S. Cl.
CPC ........ *H01L 25/167* (2013.01); *H01L 25/0753* (2013.01); *H01L 27/156* (2013.01); *H01L 33/62* (2013.01)

(58) Field of Classification Search
CPC ............... H01L 25/043; H01L 25/0753; H01L 25/0756; H01L 25/167; H01L 27/12;
(Continued)

(56) References Cited

U.S. PATENT DOCUMENTS

| 11,263,933 B2 | 3/2022 | Han et al. |
| 2015/0132873 A1 | 5/2015 | Rogers et al. |

(Continued)

FOREIGN PATENT DOCUMENTS

| EP | 3 835 856 A1 | 6/2021 |
| EP | 4 064 359 A1 | 9/2022 |

(Continued)

OTHER PUBLICATIONS

International Search Report dated Aug. 23, 2022, issued by the International Searching Authority in International Application No. PCT/KR2022/006347 (PCT/ISA/210).

(Continued)

*Primary Examiner* — Cheung Lee
(74) *Attorney, Agent, or Firm* — Sughrue Mion, PLLC

(57) ABSTRACT

A display module includes a substrate including a mounting surface and a side surface; a Thin Film Transistor (TFT) layer provided on the mounting surface of the substrate; a plurality of inorganic light emitting diodes mounted on the mounting surface of the substrate; an anisotropic conductive layer provided on an upper surface of the TFT layer and electrically connecting the TFT layer to the plurality of inorganic light emitting diodes; a front cover covering the mounting surface; and a side cover surrounding the side surface. A side end of the front cover extends to a region outside the mounting surface, and the side cover is bonded to a lower surface of the front cover and to the side surface of the substrate which correspond to the region outside of the mounting surface.

17 Claims, 20 Drawing Sheets

(51) Int. Cl.
*H01L 27/15* (2006.01)
*H01L 33/62* (2010.01)

(58) Field of Classification Search
CPC ... H01L 27/1214; H01L 27/156; H01L 33/52; H01L 33/58; H01L 33/62; H05K 5/00; H05K 5/0017; H05K 5/0021; G09F 9/302; G09F 9/3023; G09F 9/33
See application file for complete search history.

(56) References Cited

U.S. PATENT DOCUMENTS

| | | |
|---|---|---|
| 2015/0263314 A1 | 9/2015 | Sakuishi et al. |
| 2021/0183837 A1 | 6/2021 | Shin et al. |
| 2021/0202449 A1 | 7/2021 | Shin et al. |

FOREIGN PATENT DOCUMENTS

| | | |
|---|---|---|
| KR | 10-0630757 B1 | 10/2006 |
| KR | 10-2008-0036629 A | 4/2008 |
| KR | 10-2012-0069507 A | 6/2012 |
| KR | 10-2015-0102711 A | 9/2015 |
| KR | 10-2015-0107616 A | 9/2015 |
| KR | 10-2016-0004290 A | 1/2016 |
| KR | 10-2016-0143814 A | 12/2016 |
| KR | 10-2017-0018112 A | 2/2017 |
| KR | 10-2019-0046684 A | 5/2019 |
| KR | 10-2019-0096256 A | 8/2019 |
| KR | 10-2020-0025679 A | 3/2020 |
| KR | 10-2020-0025680 A | 3/2020 |
| KR | 10-2020-0134788 A | 12/2020 |
| KR | 10-2021-0063056 A | 6/2021 |
| KR | 10-2021-0075820 A | 6/2021 |
| KR | 10-2021-0083875 A | 7/2021 |

OTHER PUBLICATIONS

Written Opinion dated Aug. 23, 2022, issued by the International Searching Authority in International Application No. PCT/KR2022/006347 (PCT/ISA/237).
Communication issued Sep. 10, 2024 by the European Patent Office in European Patent Application No. 22846011.9.

ions, and durability because of its inorganic nature. In comparison with the LCD panel requiring a backlight, a micro-LED panel may offer better contrast, response times, and energy efficiency. Both organic light emitting diodes (OLEDs) and micro-LEDs corresponding to inorganic light emitting diodes have good energy efficiency. However, the micro-LED has higher brightness and emission efficiency, and longer lifetime than the OLED.

DISPLAY APPARATUS INCLUDING DISPLAY MODULE WITH ANISOTROPIC CONDUCTIVE LAYER, FRONT COVER AND SIDE COVER, AND MANUFACTURING METHOD THEREOF

CROSS-REFERENCE TO RELATED APPLICATION(S)

This application is a continuation of International Application No. PCT/KR2022/006347, filed on May 3, 2022, which is based on and claims priority under 35 U.S.C. § 119 to Korean Patent Applications No. 10-2021-0094931, filed on Jul. 20, 2021 in the Korean Intellectual Property Office, the disclosure of which is incorporated by reference herein in its entirety

BACKGROUND

1. Field

The disclosure relates to a display apparatus capable of displaying an image by combining modules in which an inorganic light emitting device that is self-luminous is mounted on a substrate.

2. Description of Related Art

A display apparatus is a type of an output device that visually displays data information such as characters and figures, and images.

In general, a display apparatus has mainly used a liquid crystal panel that requires a backlight or an organic light-emitting diode (OLED) panel provided with a film of an organic compound that emits light by itself in response to an electric current. However, the liquid crystal panel may have difficulties such as a slow-response time, and high-power consumption. Further, it is difficult to make the liquid crystal panel compact because the liquid crystal panel does not emit light by itself, and requires a backlight. In addition, because the OLED panel emits light by itself, the OLED panel does not require a backlight, and thus it is possible to make the OLED panel thin. However, the OLED panel is susceptible to screen burn-in. The screen burn-in is a phenomenon in which, if the same screen is displayed for a long time, the lifetime of the sub-pixels expires and the previous screen remains the same even when the screen is changed. Accordingly, a micro light emitting diode (micro-LED or μLED) panel that mounts an inorganic light emitting device on a substrate and uses the inorganic light emitting device itself as a pixel has been studied as a new panel to replace the OLED.

A micro-light emitting diode display panel (hereinafter, micro-LED panel) is a flat display panel and is composed of a plurality of inorganic light emitting diodes (inorganic LEDs) that are 100 micrometers or less in size.

The micro-LED panel is also a self-light emitting device, but the micro-LED does not suffer from the screen burn-in and has excellent luminance, resolution, power consumption, and durability because of its inorganic nature.

In addition, by arraying the LEDs on a circuit board in pixel units, it is possible to manufacture a display module in a substrate unit, and it is easy to manufacture in various resolutions and screen sizes according to the customer's order.

SUMMARY

Provided are a display apparatus and a manufacturing method thereof, and more particularly, a display module capable of being suitable for enlargement and a display apparatus including the display module and capable of preventing recognition of a seam caused by an anisotropic conductive layer and capable of protecting against electrostatic discharge.

Additional aspects of the disclosure will be set forth in part in the description which follows and, in part, will be obvious from the description, or may be learned by practice of the disclosure.

In accordance with an aspect of the disclosure, a display module includes: a substrate including a mounting surface and a side surface; a Thin Film Transistor (TFT) layer provided on the mounting surface of the substrate; a plurality of inorganic light emitting diodes mounted on the mounting surface of the substrate; an anisotropic conductive layer provided on an upper surface of the TFT layer and electrically connecting the TFT layer to the plurality of inorganic light emitting diodes; a front cover covering the mounting surface; and a side cover surrounding the side surface, wherein a side end of the front cover extends to a region outside the mounting surface, the side cover is bonded to a lower surface of the front cover and to the side surface of the substrate which correspond to the region outside of the mounting surface, and a side end of the anisotropic conductive layer is provided on an inner side with respect to the side end of the front cover.

The side end of the front cover and a side end of the side cover may be coplanar.

The side end of the anisotropic conductive layer may be between the side surface of the substrate and the side end of the front cover.

The display module may further include a side end member provided at a side end of the side cover, the side end member including a material having higher conductivity than a conductivity of the side cover.

The display module may further include a metal plate bonded to a rear surface of the substrate an provided on a side of the substrate that is opposite to the mounting surface.

One end of the side end member may contact the front cover.

The side end of the anisotropic conductive layer may be provided on an inner side with respect to the side surface of the substrate.

The substrate may further include a side wiring extending along the side surface of the substrate and electrically connected to the TFT layer, and the side end of the anisotropic conductive layer may be provided between a side end of the side wiring of the substrate and the side end of the front cover.

The side cover may include a non-conductive material.

The side cover may include a material that absorbs light.

The side surface of the substrate may be positioned corresponding to four edges of the mounting surface; the front cover may extend to a region outside the four edges of the mounting surface; and the side cover may contact an entirety of the lower surface of the front cover, which corresponds to the region outside of the mounting surface, and surrounds the side surface of the substrate along the four edges of the mounting surface.

In accordance with an aspect of the disclosure, a display apparatus includes: a display module array including a plurality of display modules horizontally arranged in an M×N matrix, wherein each of the plurality of display modules includes: a substrate including a mounting surface and a side surface; a Thin Film Transistor (TFT) layer is provided on the mounting surface; a plurality of inorganic light emitting diodes mounted on the mounting surface; an anisotropic conductive layer provided on an upper surface of the TFT layer and electrically connecting the TFT layer to the plurality of inorganic light emitting diodes; a front cover covering the mounting surface; and a side cover surrounding the side surface, wherein a side end of the front cover extends to a region outside the mounting surface, the side cover is bonded to a lower surface of the front cover and to the side surface of the substrate which correspond to the region outside of the mounting surface, and a side end of the anisotropic conductive layer is provided on an inner side with respect to the side end of the front cover.

The side end of the front cover and a side end of the side cover may be coplanar.

The side end of the anisotropic conductive layer may be provided between the side surface of the substrate and the side end of the front cover.

Each of the plurality of display modules may further include a side end member provided at a side end of the side cover, the side end member including a material having higher conductivity than a conductivity of the side cover.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
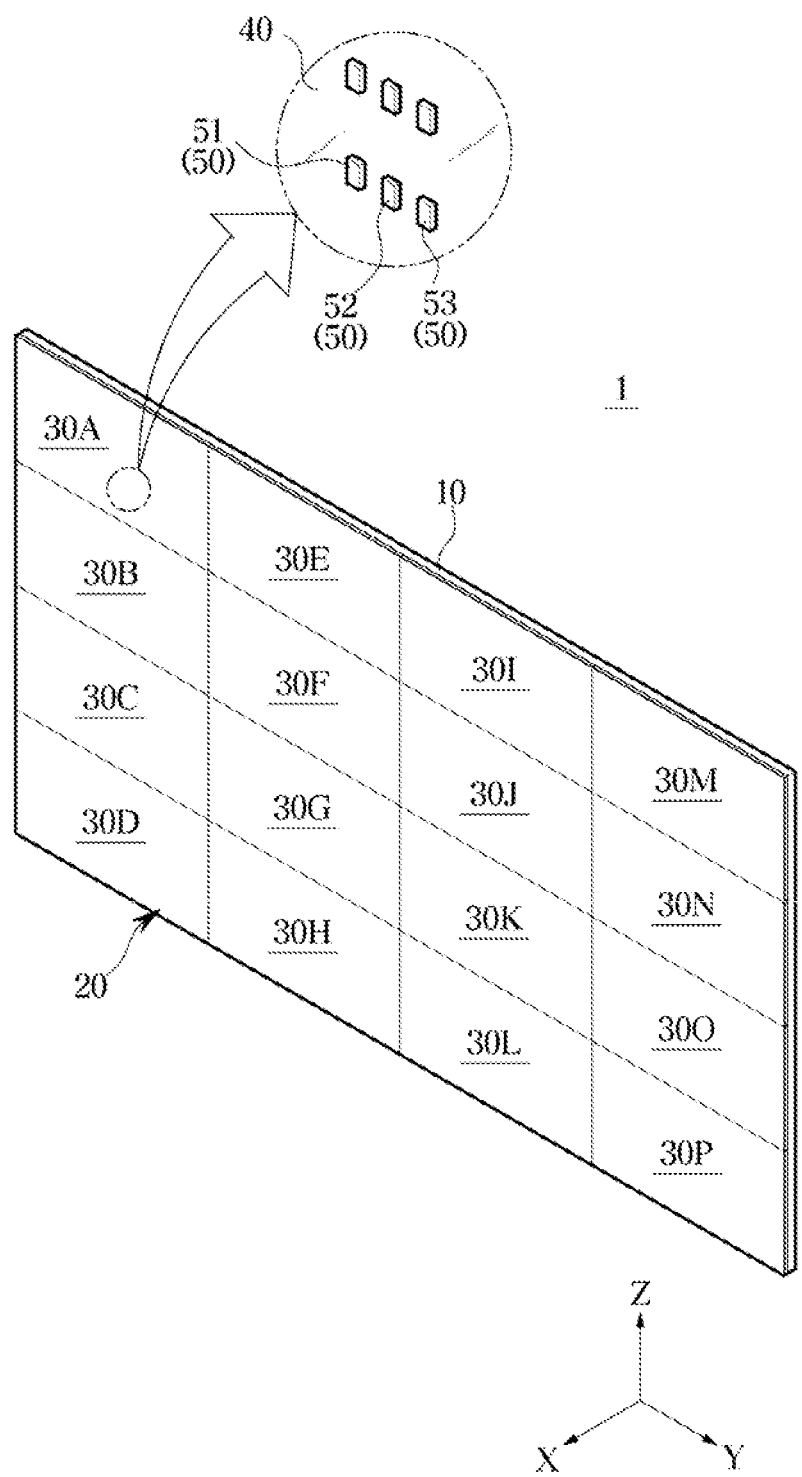
FIG. 1 is a view illustrating a display apparatus according to an embodiment of the disclosure.

Embodiments described in the disclosure and configurations shown in the drawings are merely examples, and the scope of the disclosure should be understood to include various modifications or equivalents to replace the embodiments at the time of filing of the present application.

The singular forms "a," "an" and "the" are intended to include the plural forms as well, unless the context clearly indicates otherwise. The shapes and sizes of elements in the drawings may be exaggerated for the clear description.

In this disclosure, the terms "including", "having", and the like are used to specify features, numbers, steps, operations, elements, components, or combinations thereof, but do not preclude the presence or addition of one or more of the features, elements, steps, operations, elements, components, or combinations thereof.

Also, in the present disclosure, the meaning of "identical" includes things that are similar to each other in properties or are similar within a certain range. Also, "identical" means "substantially identical". It should be understood that "substantially identical" means that a value corresponding to differences within a negligible range with respect to a reference value or a numerical value corresponding to a manufacturing error range are included in the range of "identical".

Hereinafter embodiments according to the disclosure will be described in detail with reference to the accompanying drawings.

Figure 2:
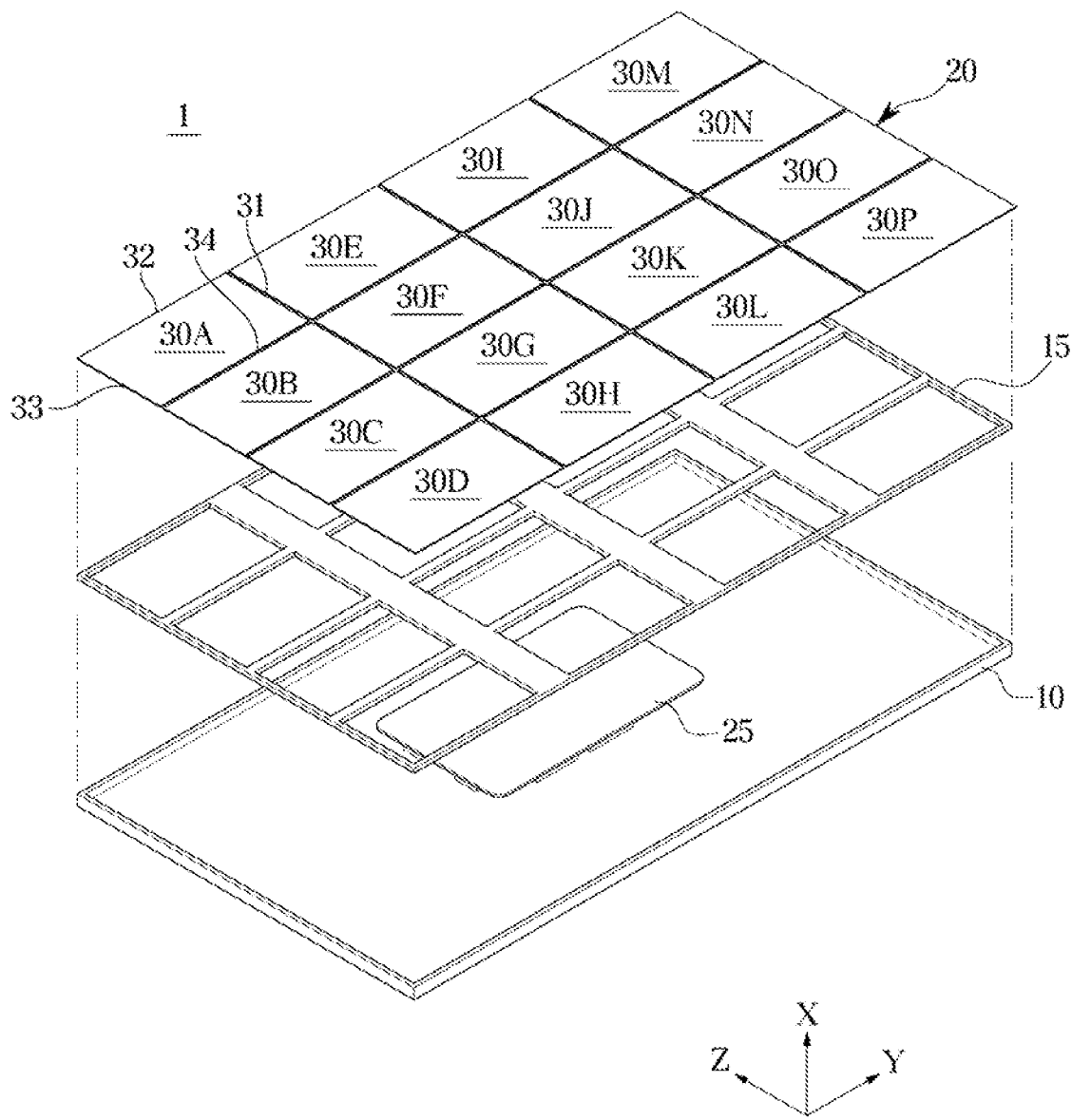
FIG. 2 is an exploded-view illustrating a main configuration of the display apparatus of FIG. 1.
Figure 3:
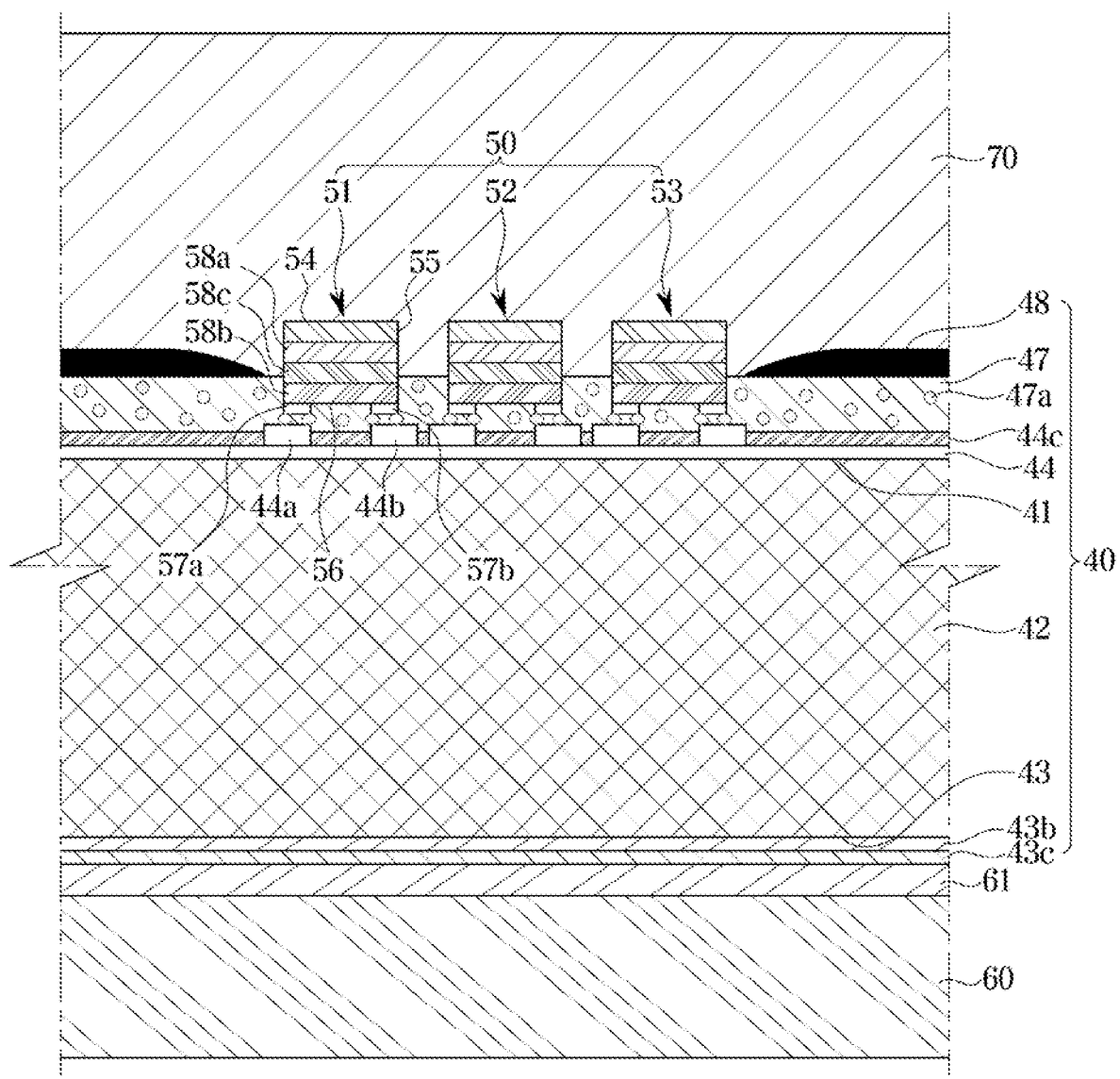
FIG. 3 is an enlarged cross-sectional view illustrating a part of one display module shown in FIG. 1.
Figure 4:
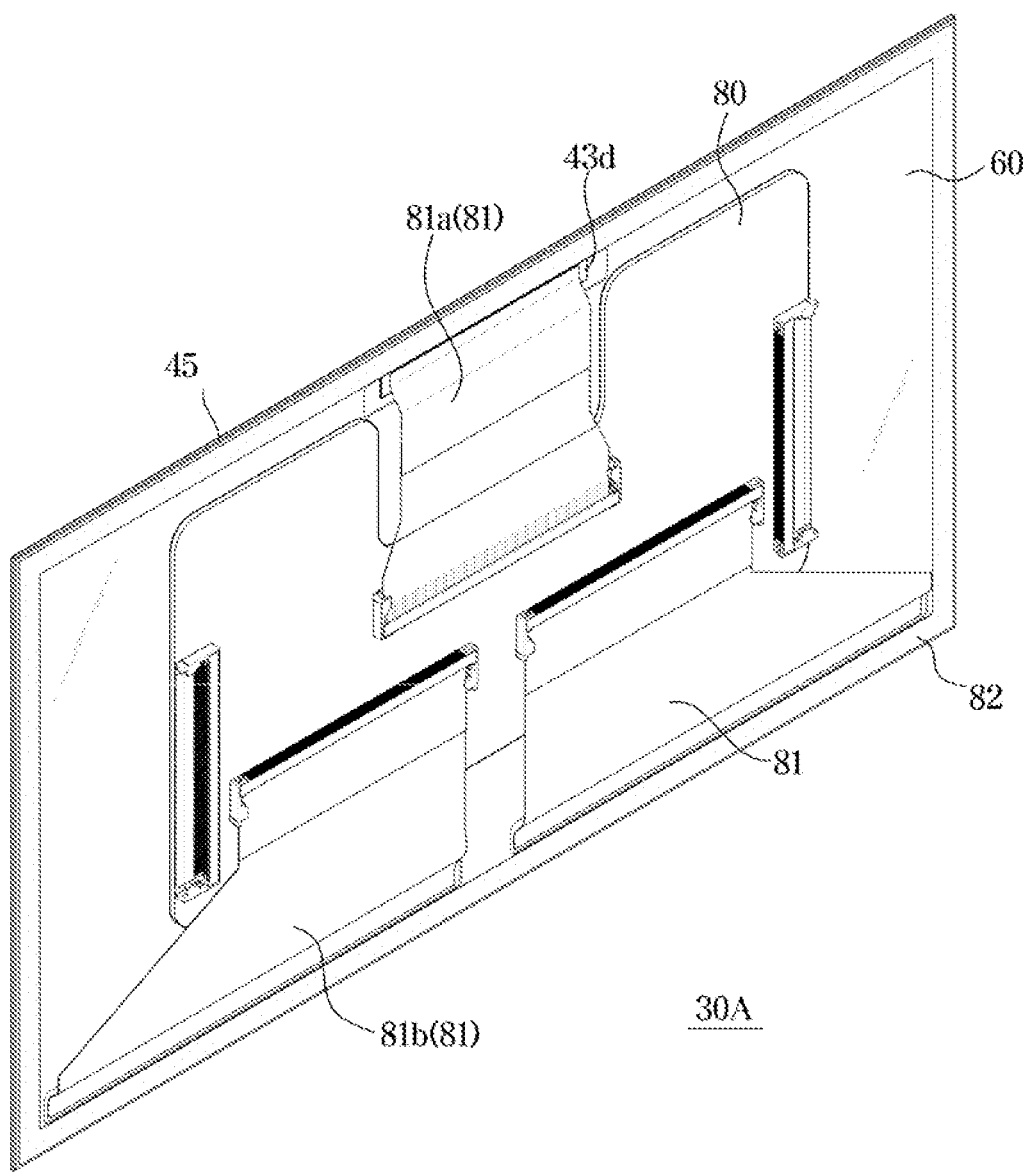
FIG. 4 is a rear perspective view illustrating the display module of the display apparatus shown in FIG. 1.
Figure 5:
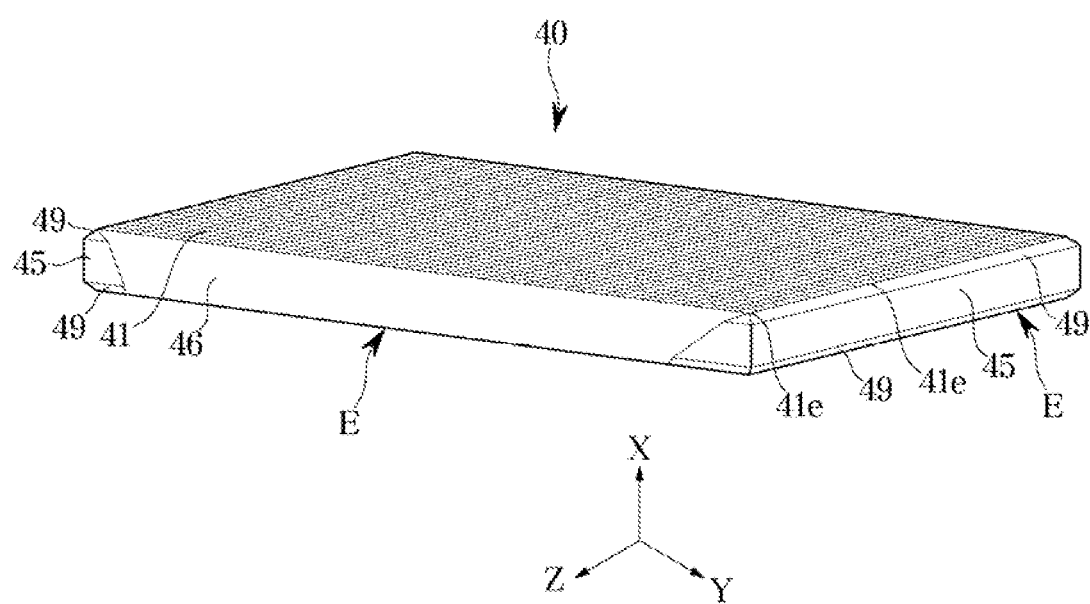
FIG. 5 is a perspective view illustrating a part of the configuration of the display module shown in FIG. 1.

FIG. 1 is a view illustrating a display apparatus according to an embodiment of the disclosure, FIG. 2 is an exploded-view illustrating a main configuration of the display apparatus of FIG. 1, FIG. 3 is an enlarged cross-sectional view illustrating a part of one display module shown in FIG. 1, FIG. 4 is a rear perspective view illustrating the display module of the display apparatus shown in FIG. 1, and FIG. 5 is a perspective view illustrating a part of the configuration of the display module shown in FIG. 1.

A part of a configuration of a display apparatus 1 as well as a plurality of inorganic light emitting diodes 50 illustrated in the drawings is a component in a micro-unit having a size of several μm to hundreds of μm, and for convenience of description, dimensions of some components (e.g., the plurality of inorganic light emitting diodes 50 and a black matrix 48, etc.) are exaggerated.

The display apparatus 1 is a device that displays information, material, data, etc. as characters, figures, graphs, images, etc. and a television, a personal computer, mobile, and a digital signage may be implemented as the display apparatus 1.

According to an embodiment of the disclosure, as shown in FIGS. 1 and 2, the display apparatus 1 may include a display panel 20 provided to display an image, a power supply device configured to supply power to the display panel 20, a main board 25 configured to control an overall operation of the display panel 20, a frame 15 provided to support the display panel 20, and a rear cover 10 provided to cover a rear surface of the frame 15.

The display panel 20 may include a plurality of display modules 30A-30P, a driver board configured to drive each of the display modules 30A-30P, and a timing controller (T-con) board configured to generate a timing signal to control each of the display modules 30A-30P.

The rear cover 10 may support the display panel 20. The rear cover 10 may be installed on the floor using a stand, or may be installed on a wall using a hanger.

The plurality of display modules 30A-30P may be arranged vertically and horizontally to be adjacent to each other (e.g., in a contiguous arrangement). The plurality of display modules 30A-30P may be arranged in an M*N matrix. In the embodiment, 16 display modules 30A-30P are provided and arranged in a matrix of 4*4, but there is no limitation in the number and arrangement method of the plurality of display modules 30A-30P.

The plurality of display modules 30A-30P may be installed in the frame 15. The plurality of display modules 30A-30P may be installed in the frame 15 through various known methods such as magnetic force using a magnet or a mechanical fitting structure. The rear cover 10 may be coupled to the rear of the frame 15, and the rear cover 10 may form a rear exterior of the display apparatus 1.

The rear cover 10 may include a metal material. Accordingly, heat generated from the plurality of display modules 30A-30P and the frame 15 may be easily conducted to the rear cover 10 to increase the heat dissipation efficiency of the display apparatus 1.

As described above, the display apparatus 1 may implement a large screen by tiling the plurality of display modules 30A-30P.

As another example, a single display module in the plurality of display modules 30A-30P may be applied to a display apparatus. That is, as a single unit, the display modules 30A-30P may be installed and applied in a wearable device, a portable device, a handheld device and an electronic product or an electronic component that requires a display. As described in the disclosure, the plurality of display modules 30A-30P may be assembled in a matrix type and then applied to a display apparatus such as a monitor for a personal computer (PC), a high-resolution TV, a signage, or an electronic display.

The plurality of display modules 30A-30P may include the same configuration. Accordingly, a description of any one display module described below may be equally applied to all other display modules.

Hereinafter each of the plurality of display modules 30A-30P will be described with reference to a first display module 30A because all of the plurality of display modules 30A-30P are formed identically.

That is, in order to avoid overlapping description, a display module 30, a substrate 40, and a front cover 70 will be described as representative of the configuration of the plurality of display modules 30A-30P.

In addition, the first display module 30A, a second display module 30E arranged adjacent to the first display module 30A in a second direction Y, and a third display module 30B arranged adjacent in a third direction Z among the plurality of display modules 30A-30P will be described if necessary.

Among the plurality of display modules 30A-30P, the first display module 30A may be formed in a quadrangle type. Alternatively, the first display module 30A may be provided in a rectangular type or a square type.

Accordingly, the first display module 30A may include edges 31, 32, 33, and 34 formed in up, down, left and right direction with respect to a first direction X, which is a front direction perpendicular to a display surface of the display apparatus 1.

As illustrated in FIG. 3, each of the plurality of display modules 30A-30P may include the substrate 40 and a plurality of inorganic light emitting diodes 50 mounted on the substrate 40. The plurality of inorganic light emitting diodes 50 may be mounted on a mounting surface 41 of the substrate 40 facing the first direction X. In FIG. 3, for convenience of description, a thickness of the substrate 40 in the first direction X is shown to be enlarged.

The substrate 40 may be formed in a quadrangle type. As described above, each of the plurality of display modules 30A-30P may be provided in a quadrangle type, and thus the substrate 40 may be formed in a quadrangle type to correspond to the type of the display module.

Alternatively, the substrate 40 may be provided in a rectangle type or a square type.

Therefore, as for the first display module 30A, the substrate 40 may include 4 edges E corresponding to the edges 31, 32, 33, and 34 of the first display module 30A formed in in four directions of up, down, left and right with respect to the first direction X that is the front direction (refer to FIG. 5).

The substrate 40 may include a substrate body 42, the mounting surface 41 forming one surface of the substrate body 42, a rear surface 43 arranged on the opposite side to the mounting surface 41 and forming the other surface of the substrate body 42, and a side surface 45 arranged between the mounting surface 41 and the rear surface 43.

The side surface 45 may form a side end of the substrate 40 in the second direction Y and the third direction Z that are perpendicular to the first direction X.

The substrate 40 may include a chamfer 49 formed between the mounting surface 41 and the side surface 45 and between the rear surface 43 and the side surface 45.

The chamfer 49 may prevent the respective substrates from colliding and being damaged when the plurality of display modules 30A-30P is arranged.

The edge E of the substrate 40 may include the side surface 45 and the chamfer 49.

The substrate 40 may include a thin film transistor (TFT) layer 44 formed on the substrate body 42 to drive the inorganic light emitting diodes 50. The substrate body 42 may include a glass substrate. That is, the substrate 40 may include a Chip on Glass (COG) type substrate. First and second pad electrodes 44a and 44b provided to electrically connect the inorganic light emitting diodes 50 to the TFT layer 44 may be formed on the substrate 40.

A thin film transistor (TFT) forming the TFT layer 44 is not limited to a specific structure or type, and may be configured in various embodiments. That is, the TFT of the TFT layer 44 according to an embodiment of the disclosure may be implemented as an organic TFT and a graphene TFT as well as a Low Temperature Poly Silicon (LTPS) TFT, an oxide TFT, and a Si TFT such as a poly silicon, or a-silicon TFT.

Alternatively, when the substrate body 42 of the substrate 40 is formed of a silicon wafer, the TFT layer 44 may be replaced with a Complementary Metal-Oxide Semiconductor (CMOS) transistor, or n-type MOSFET or p-type MOSFET transistor.

The plurality of inorganic light emitting diodes 50 may be formed of an inorganic material, and may include inorganic light emitting diodes having sizes of several μm to several tens of μm in width, length, and height, respectively. The micro-inorganic light emitting device may have a length of 100 μm or less on a short side among width, length, and height. That is, the inorganic light emitting device 50 may be picked up from a sapphire or silicon wafer and directly transferred onto the substrate 40. The plurality of inorganic light emitting diodes 50 may be picked up and transported through an electrostatic method using an electrostatic head or a stamp method using an elastic polymer material such as PDMS or silicon as a head.

The plurality of inorganic light emitting diodes 50 may be a light emitting structure including an n-type semiconductor 58a, an active layer 58c, a p-type semiconductor 58b, a first contact electrode 57a, and a second contact electrode 57b.

Any one of the first contact electrodes 57a and the second contact electrodes 57b may be electrically connected to the n-type semiconductor 58a and the other of the first contact electrodes 57a and the second contact electrodes 57b may be electrically connected to the p-type semiconductor 58b.

The first contact electrode 57a and the second contact electrode 57b may be a flip chip type in which the first contact electrode 57a and the second contact electrode 57b are horizontally arranged to face the same direction (a direction opposite to an emission direction).

The inorganic light emitting device 50 may include a light emitting surface 54 arranged to face the first direction X, a side surface 55, and a bottom surface 56 arranged to be opposite to the light emitting surface 54, which are based on arrangement in which the inorganic light emitting device 50 is mounted on the mounting surface 41. The first contact electrode 57a and the second contact electrode 57b may be formed on the bottom surface 56.

That is, the contact electrodes 57a and 57b of the inorganic light emitting device 50 may be arranged on the opposite side of the light emitting surface 54, and accordingly, the contact electrodes 57a and 57b may be arranged on the opposite side to the direction in which light is emitted.

The contact electrodes 57a and 57b may be arranged to face the mounting surface 41, and provided to be electrically connected to the TFT layer 43. The light emitting surface 54 emitting light may be arranged in a direction opposite to the direction in which the contact electrodes 57a and 57b are arranged.

Therefore, when the light generated from the active layer 58c is emitted in the first direction X through the light emitting surface 54, the light may be emitted toward the first direction X without the interference of the first contact electrode 57a or the second contact electrode 57b.

That is, the first direction X may be defined as a direction in which the light emitting surface 54 is arranged to emit light.

The first contact electrode 57a and the second contact electrode 57b may be electrically connected to a first pad electrode 44a and a second pad electrode 44b, respectively, formed on the mounting surface 41 side of the substrate 40.

The inorganic light emitting device 50 may be directly connected to the pad electrodes 44a and 44b through an anisotropic conductive layer 47 or a bonding structure such as solder.

The anisotropic conductive layer 47 may be formed on the substrate 40 to mediate electrical bonding between the contact electrodes 57a and 57b and the pad electrodes 44a and 44b. The anisotropic conductive layer 47 may include a structure in which an anisotropic conductive adhesive is attached on a protective film, and particularly, a structure in which conductive balls 47a are dispersed in an adhesive resin. The conductive balls 47a may be conductive spheres surrounded by a thin insulating film, and may electrically connect to each other and/or to other conductors as the insulating film is broken by pressure.

The anisotropic conductive layer 47 may include an anisotropic conductive film (ACF) in the form of a film and an anisotropic conductive paste (ACP) in the form of a paste.

In an embodiment, the anisotropic conductive layer 47 may be provided with an anisotropic conductive film.

Therefore, by a pressure applied to the anisotropic conductive layer 47 when the plurality of inorganic light emitting diodes 50 is mounted on the substrate 40, the insulating film of the conductive balls 47a may be broken and thus the contact electrodes 57a and 57b of the inorganic light emitting device 50 may be electrically connected to the pad electrodes 44a and 44b of the substrate 40.

However, the plurality of inorganic light emitting diodes 50 may be mounted on the substrate 40 through solder instead of the anisotropic conductive layer 47. After the inorganic light emitting device 50 is aligned on the substrate 40, the inorganic light emitting device 50 may be bonded to the substrate 40 through a reflow process.

The plurality of inorganic light emitting diodes 50 may include a red light emitting device 51, a green light emitting device 52, and a blue light emitting device 53. As for the inorganic light emitting device 50, a series of the red light emitting device 51, the green light emitting device 52, and the blue light emitting device 53 may be mounted on the mounting surface 41 of the substrate 40 as one unit. A series of the red light emitting device 51, the green light emitting device 52, and the blue light emitting device 53 may form a single pixel. In this case, the red light emitting device 51, the green light emitting device 52, and the blue light emitting device 53 may each form a sub pixel, respectively.

The red light emitting device 51, the green light emitting device 52, and the blue light emitting device 53 may be arranged in a line at a predetermined interval in an embodiment, and alternatively, arranged in other shapes such as a triangular shape.

The substrate 40 may include a light absorbing layer 44c to absorb external light to improve contrast. The light absorbing layer 44c may be formed on the entire mounting surface 41 of the substrate 40. The light absorbing layer 44c may be formed between the TFT layer 43 and the anisotropic conductive layer 47.

The plurality of display modules 30A-30P may further include a black matrix 48 formed between the plurality of inorganic light emitting diodes 50.

The black matrix 48 may perform a function of supplementing the light absorbing layer 44c formed entirely on the mounting surface 41 side of the substrate 40. That is, the black matrix 48 may absorb external light to allow the substrate 40 to appear black, thereby improving the contrast of the screen.

It is appropriate that the black matrix 48 has a black color.

According to an embodiment, the black matrix 48 may be arranged between pixels formed by a series of the red light emitting device 51, the green light emitting device 52, and the blue light emitting device 53. As another example, the black matrix 48 may be formed more precisely to partition each of the light emitting devices 51, 52, and 53 corresponding to the sub-pixel.

The black matrix 48 may be formed in a grid shape having a horizontal pattern and a vertical pattern to be arranged between pixels.

The black matrix 48 may be formed by applying a light-absorbing ink on the anisotropic conductive layer 47 and then curing the light-absorbing ink through an ink-jet process, or by coating a light-absorbing film on the anisotropic conductive layer 47.

That is, on the anisotropic conductive layer 47 formed entirely on the mounting surface 41, the black matrix 48 may be arranged on a space, in which the plurality of inorganic light emitting diodes 50 is not mounted, between the plurality of inorganic light emitting diodes 50.

The plurality of display modules 30A-30P may include a front cover 70 arranged in the first direction X on the mounting surface 41 to cover the mounting surface 41 of the plurality of display modules 30A-30P.

Figure 6:
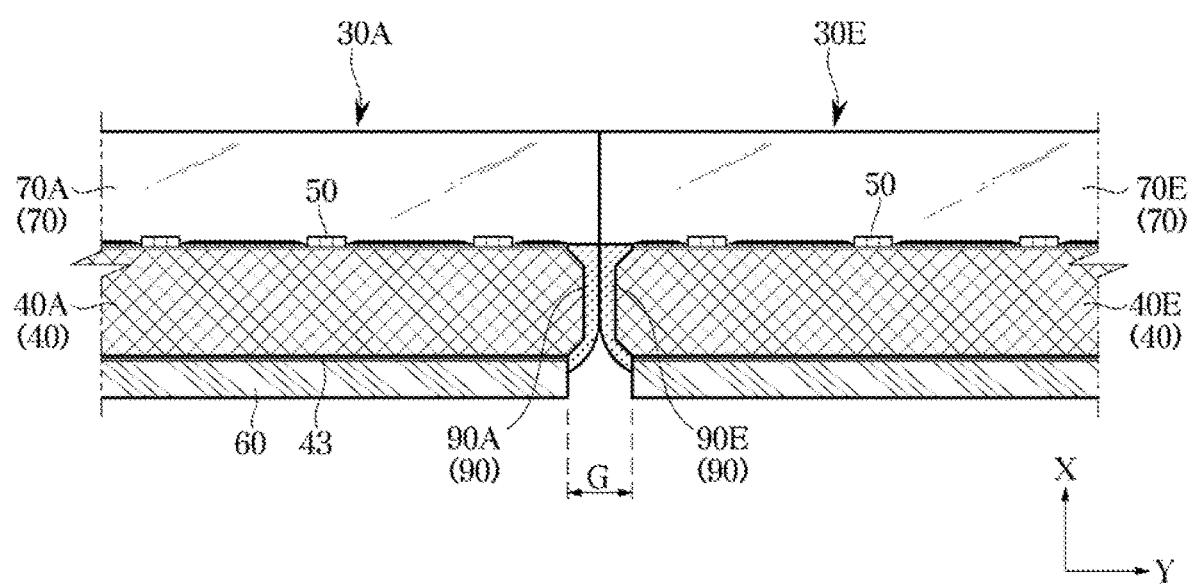
FIG. 6 is a cross-sectional view illustrating a part of the configuration of the display apparatus of FIG. 1 with respect to a second direction.
Figure 7:
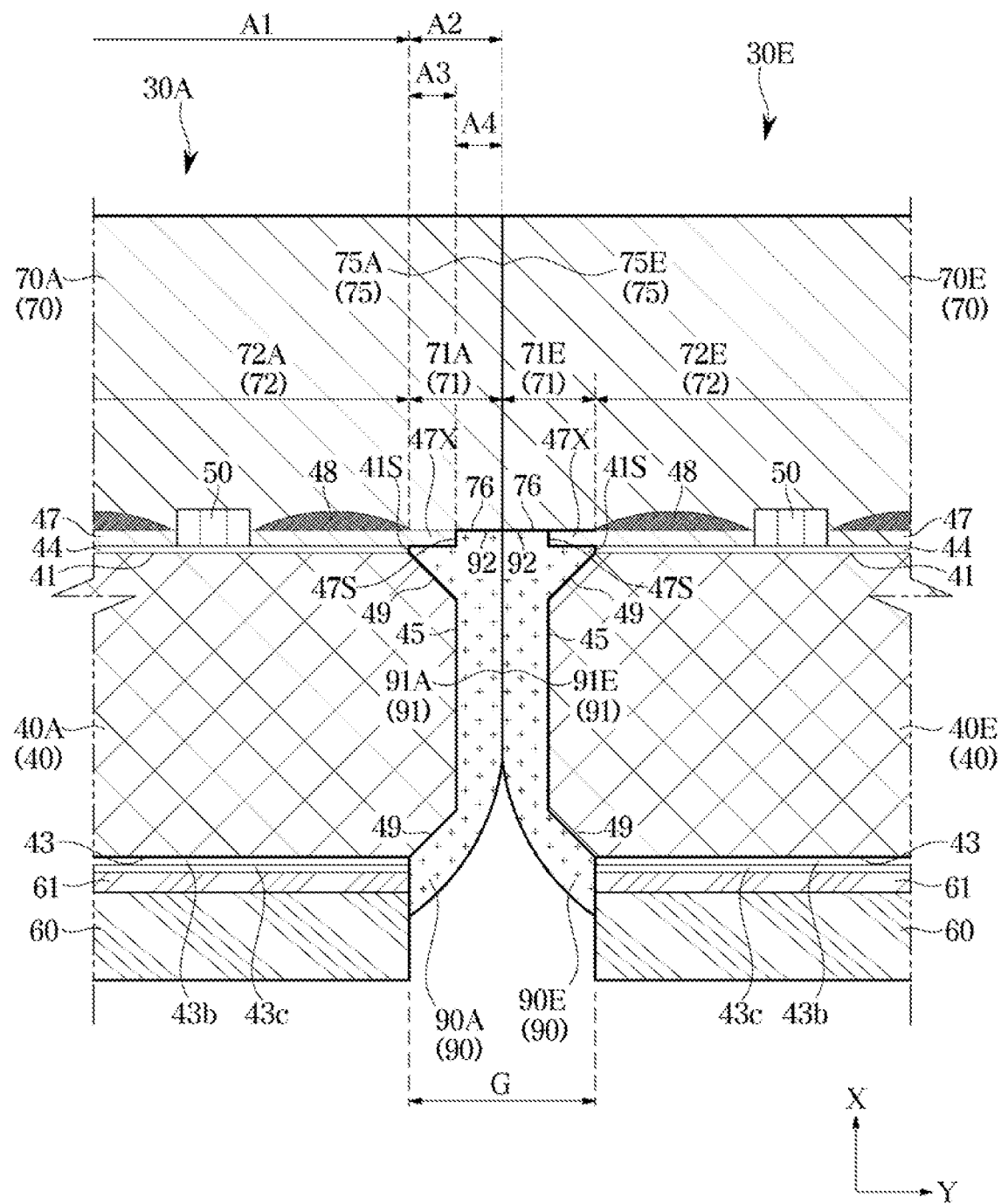
FIG. 7 is an enlarged cross-sectional view illustrating a part of the configuration shown in FIG. 6.

The front cover 70 may be provided in plurality so as to be respectively formed in the first direction X on the plurality of display modules 30A-30P (refer to FIGS. 6 and 7).

Each of the plurality of display modules 30A-30P may be assembled after a separate front cover 70 is formed. That is, as for the first display module 30A and the second display module 30E among the plurality of display modules 30A-30P, a first front cover 70A may be formed on the mounting surface 41 of the first display module 30A and a second front cover 70E may be formed on the mounting surface 41 of the second display module 30E.

The front cover 70 may be provided to cover the substrate 40 to protect the substrate 40 from external force or external moisture.

A plurality of layers of the front cover 70 may be provided as a functional film having optical performance. This will be described later in detail.

A part of the plurality of layers of the first cover 70 may include a base layer formed of optical clear resin (OCR). The base layer may be provided to support a plurality of other layers. The OCR may be in a very transparent state having a transmittance of 90% or more.

The OCR may improve visibility and image quality by increasing transmittance through low reflection properties. That is, in a structure including an air gap, light loss may occur due to the difference in refractive index between the film layer and the air layer. However, in a structure including the OCR, the difference in refractive index may be reduced and thus light-loss may also be reduced, thereby improving visibility and image quality.

That is, the OCR may improve image quality as well as protecting the substrate 40.

A part of the plurality of layers may include an adhesive layer provided to bond the front cover 70 to the mounting surface 41 of the substrate 40.

Typically, the front cover 70 may be provided to include a predetermined height or more in the first direction X to which the mounting surface 41 or the light emitting surface 54 faces.

This is to sufficiently fill a gap that may be formed between the front cover 70 and the plurality of inorganic light emitting diodes 50 when the front cover 70 is formed on the substrate 40.

In addition, each of the plurality of display modules 30A-30P may include a rear adhesive tape 61 arranged between the rear surface 43 and a metal plate 60 to bond the metal plate 60 to the rear surface 43 of the substrate 40.

The rear adhesive tape 61 may be provided as a double-sided adhesive tape, but is not limited thereto, and may be provided in the form of an adhesive layer instead of a tape shape. That is, the rear adhesive tape 61 is an example of a medium for bonding the metal plate 60 to the rear surface 43 of the substrate 40, and is not limited to the tape and may be provided in various medium shapes.

The plurality of inorganic light emitting diodes 50 may be electrically connected to a pixel driving wiring formed on the mounting surface 41, and an upper wiring layer extending through the side surface 45 of the substrate 40 and formed as a pixel driving wiring.

The upper wiring layer may be formed under the anisotropic conductive layer 47. The upper wiring layer may be electrically connected to a side wiring 46 formed on the side surface 45 of the substrate 40. The side wiring 46 may be provided in the form of a thin film (see, e.g., FIG. 5). The side wiring 46 may include a side wiring coating 46b surrounding the side wiring 46 to prevent damage that may occur when the side wiring 46 is exposed to the outside (refer to FIG. 9).

When it is assumed that with respect to the first direction X facing the front of the display apparatus 1, a direction perpendicular to the first direction X and corresponding to the left and right direction of the display apparatus 1 is defined as the second direction Y, and a direction perpendicular to the first direction X and the second direction Y, and corresponding to the up and down direction of the display apparatus 1 is defined as the third direction Z, the side wiring 46 may extend to the rear surface 43 of the substrate 40 along the chamfer 49 and the side surface 45 of the substrate 40 in the third direction Z, along the third direction Z.

However, the disclosure is not limited thereto and the side wiring 46 may extend to the rear surface 43 of the substrate 40 along the chamfer 49 and the side surface 45 of the substrate 40 in the second direction Y, along the second direction Y.

According to an embodiment, the side wiring 46 may extend along one or more edges E of the substrate 40 corresponding to the upper edge 32 and/or the lower edge 34 of the first display module 30A.

However, the disclosure is not limited thereto, and the side wiring 46 may extend along one or more edges E of the substrate 40 corresponding to at least two edges among four edges 31, 32, 33 and 34 of the first display module 30A.

The upper wiring layer may be connected to the side wiring 46 by an upper connection pad formed on the edge E side of the substrate 40.

The side wiring 46 may extend along the side surface 45 of the substrate 40 and may be connected to a rear wiring layer 43b formed on the rear surface 43.

An insulating layer 43c covering the rear wiring layer 43b may be formed on the rear wiring layer 43b in a direction to which the rear surface of the substrate 40 faces.

That is, the plurality of inorganic light emitting diodes 50 may be sequentially and electrically connected to the upper wiring layer, the side wiring 46, and the rear wiring layer 43b.

Further, as shown in FIG. 4, the display module 30A may include a driver circuit board 80 provided to electrically control the plurality of inorganic light emitting diodes 50 mounted on the mounting surface 41. The driver circuit board 80 may be formed of a printed circuit board. The driver circuit board 80 may be arranged on the rear surface 43 of the substrate 40 in the first direction X. Although described in detail later, the driver circuit board 80 may be arranged on the metal plate 60 bonded to the rear surface 43 of the substrate 40.

The display module 30A may include a flexible film 81 connecting the driver circuit board 80 to the rear wiring layer 43b to allow the driver circuit board 80 to be electrically connected to the plurality of inorganic light emitting diodes 50.

Particularly, one end of the flexible film 81 may be connected to a rear connection pad 43d arranged on the rear surface 43 of the substrate 40 and electrically connected to the plurality of inorganic light emitting diodes 50.

The rear connection pad 43d may be electrically connected to the rear wiring layer 43b. Accordingly, the rear connection pad 43d may electrically connect the rear wiring layer 43b to the flexible film 81 (see, e.g., FIGS. 7 and 8).

Because the flexible film 81 is electrically connected to the rear connection pad 43d, the flexible film 81 may transmit power and an electrical signal from the driver circuit board 80 to the plurality of inorganic light emitting diodes 50.

The flexible film 81 may be formed of a flexible flat cable (FFC) or a chip on film (COF).

The flexible film 81 may include a first flexible film 81a and a second flexible film 81b that are respectively arranged in the up and down direction (e.g., the direction Z).

The first and second flexible films 81a and 81b are not limited thereto, and may be arranged in the left and right directions (e.g., the direction Y), or may be arranged in at least two directions in the up, down, left, and right directions, respectively.

The second flexible films 81b may be provided in plurality. However, the disclosure is not limited thereto, and a single second flexible film 81b may be provided, and the first flexible films 81a may also be provided in plurality.

The first flexible film 81a may transmit a data signal from the driver circuit board 80 to the substrate 40. The first flexible film 81a may be formed of COF.

The second flexible film 81b may transmit power from the driver circuit board 80 to the substrate 40. The second flexible film 81b may be formed of FFC.

However, the disclosure is not limited thereto, and the first flexible film 81a may be formed of FFC and the second flexible film 81b may be formed of COF.

The driver circuit board 80 may be electrically connected to a main board 25 (refer to FIG. 2). The main board 25 may be arranged on the rear side of the frame 15, and at the rear of the frame 15, the main board 25 may be connected to the driver circuit board 80 through a cable.

As described above, the metal plate 60 may be provided to be in contact with the substrate 40. The metal plate 60 and the substrate 40 may be bonded to each other by the rear adhesive tape 61 arranged between the rear surface 43 of the substrate 40 and the metal plate 60.

The metal plate 60 may be formed of a metal material having high thermal conductivity. For example, the metal plate 60 may be formed of an aluminum material.

Heat generated by the plurality of inorganic light emitting diodes 50 mounted to the substrate 40 and the TFT layer 44 may be transferred to the metal plate 60 through the rear adhesive tape 61 along the rear surface 43 of the substrate 40.

Accordingly, heat generated by the substrate 40 may be easily transferred to the metal plate 60 and it is possible to prevent the substrate 40 from rising above a predetermined temperature.

The plurality of display modules 30A-30P may be arranged in various positions in the form of an M*N matrix. Each of the display modules 30A-30P is provided to be individually movable. In this case, each of the display modules 30A-30P may include the metal plate 60 to maintain a certain level of heat dissipation performance regardless of where each of the display modules 30A-30P is arranged.

The plurality of display modules 30A-30P may be provided in the form of various M*N matrixes so as to form various-sized screen of the display apparatus 1. According to an embodiment, rather than heat dissipation through a single metal plate provided for heat dissipation, each of the display modules 30A-30P may include an independent metal plate 60 so as to individually dissipate the heat, thereby improving the heat dissipation performance of the entire display apparatus 1.

When a single metal plate is arranged inside the display apparatus 1, a part of the metal plate may not be arranged at a position corresponding to a position where some display modules are arranged in the front and rear direction, and the metal plate may be arranged at a position corresponding to a position where any display module is not arranged in the front and rear direction. Therefore, the heat dissipation efficiency of the display apparatus 1 may be reduced.

That is, the display modules 30A-30P may perform self-dissipation by the metal plate 60, arranged on the display modules 30A-30P, regardless of the position of the display modules 30A-30P, and thus it is possible to improve the heat dissipation performance of the entire display modules 30A-30P.

The metal plate 60 may be provided in a quadrangular shape substantially corresponding to the shape of the substrate 40.

An area of the substrate 40 may be at least equal to or greater than an area of the metal plate 60. In response to the substrate 40 and the metal plate 60 being arranged side by side in the first direction X (e.g., stacked in the direction X), the four edges of the substrate 40 having a rectangular shape may be formed to correspond to the four edges of the metal plate 60 with respect to the center of the substrate 40 and the metal plate 60, or the four edges of the substrate 40 having a rectangular shape may be formed to be arranged on the outer side with respect to the four edges of the metal plate 60.

It is appropriate that the four edges E of the substrate 40 are arranged outside the four edges of the metal plate 60. That is, the area of the substrate 40 may be provided to be greater than the area of the metal plate 60.

The substrate 40 and the metal plate 60 may thermally expand by heat transferred to each of the display modules 30A-30P. Because the metal plate 60 has a higher coefficient of thermal expansion than the substrate 40, a value at which the metal plate 60 expands is greater than a value at which the substrate 40 expands.

In this case, in response to the four edges E of the substrate 40 being formed to correspond to the four edges of the metal plate 60 or being arranged on the inner side with respect to the four edges of the metal plate 60, the edge of the metal plate 60 may protrude to the outside of the substrate 40.

Accordingly, a separation distance between gaps formed between the respective display modules 30A-30P may be irregularly formed by the thermal expansion of the metal plate 60 of each of the modules 30A-30P. Therefore, some of the seams may be easily recognized and thus a sense of unity in the screen of the display panel 20 may be reduced.

However, when the four edges E of the substrate 40 are arranged outside the four edges of the metal plate 60, even when the substrate 40 and the metal plate 60 thermally expand, the metal plate 60 may not protrude to the outside of the four edges E of the substrate 40. Accordingly, the separation distance of the gap formed between the display modules 30A-30P may be constantly maintained.

In addition, in order to maintain a constant separation distance of the gap formed between the display modules 30A-30P, the frame 15 supporting the display modules 30A-30P may include a front surface having a material property similar to the substrate 40. That is, each of the display modules 30A-30P may be bonded to the front surface of the frame 15.

According to an embodiment of the disclosure, the area of the substrate 40 may be provided to substantially correspond to the area of the metal plate 60. Accordingly, heat generated from the substrate 40 may be evenly dissipated in the entire region of the substrate 40 without being isolated to a partial region.

The metal plate 60 may be bonded to the rear surface 43 of the substrate 40 by the rear adhesive tape 61.

The rear adhesive tape 61 may have a size corresponding to that of the metal plate 60. That is, the area of the rear adhesive tape 61 may be provided to correspond to the area of the metal plate 60. The metal plate 60 may be provided in a substantially quadrangular shape, and the rear adhesive tape 61 may be provided in a quadrangular shape to correspond to the shape of the metal plate 60.

The edge of the metal plate 60 and the edge of the rear adhesive tape 61 in the rectangular shape may be formed to correspond to each other with respect to the center of the metal plate 60 and the rear adhesive tape 61.

Accordingly, the metal plate 60 and the rear adhesive tape 61 may be easily manufactured in a single coupling configuration, and thus it is possible to increase the manufacturing efficiency of the entire display apparatus 1.

That is, when the metal plate 60 is cut from one plate into a unit number, the rear adhesive tape 61 may be pre-bonded to one plate before the metal plate 60 is cut, and thus the rear adhesive tape 61 and the metal plate 60 may be simultaneously cut into a unit number, thereby simplifying the process.

Heat generated by the substrate 40 may be transferred to the metal plate 60 through the rear adhesive tape 61. Accordingly, the rear adhesive tape 61 may be provided to bond the metal plate 60 to the substrate 40 while transferring the heat generated by the substrate 40 to the metal plate 60.

Accordingly, the rear adhesive tape 61 may include a material having high heat dissipation performance.

Basically, the rear adhesive tape 61 may include a material having an adhesive property to bond the substrate 40 and the metal plate 60.

Additionally, the rear adhesive tape 61 may include a material having higher heat dissipation performance than a material having general adhesive properties. Accordingly, heat may be efficiently transferred from between the substrate 40 and the metal plate 60 to each component.

In addition, the material having the adhesiveness of the rear adhesive tape 61 may be formed of a material having higher heat dissipation performance than the adhesive material forming the general adhesive.

A material having higher heat dissipation performance means a material that effectively transfers heat with high thermal conductivity, high heat transfer, and low specific heat.

For example, the rear adhesive tape 61 may include a graphite material. However, the disclosure is not limited thereto, and the rear adhesive tape 61 may be generally formed of a material having high heat dissipation performance.

Flexibility of the rear adhesive tape 61 may be greater than that of the substrate 40 and that of the metal plate 60. Accordingly, the rear adhesive tape 61 may be formed of a material having high flexibility while having adhesive properties and heat dissipation properties. The rear adhesive tape 61 may be formed of an inorganic double-sided tape. As described above, the rear adhesive tape 61 is formed of an inorganic tape, and thus the rear adhesive tape 61 may be provided as a single layer without a base material supporting one surface bonded to the substrate 40 and the other surface bonded to the metal plate 60, between the one surface and the other surface.

Because the rear adhesive tape 61 does not include a base material, the rear adhesive tape 61 may not include a material that interferes with heat conduction, thereby increasing the heat dissipation performance. However, the rear adhesive tape 61 is not limited to the inorganic double-sided tape, and may be provided as a heat-dissipating tape having better heat dissipation performance than a general double-sided tape.

As described above, because the substrate 40 is formed of a glass material and the metal plate 60 is formed of a metal material, the material property thereof may be different from each other and thus a degree of deformation of the material by the same heat may be different. That is, in response to heat generated in the substrate 40, the substrate 40 and the metal plate 60 may thermally expand to different sizes due to heat. Accordingly, the display module 30A may be damaged.

The substrate 40 and the metal plate 60 have different expansion values at the same temperature, and thus when the substrate 40 and the metal plate 60 expand to different sizes in a state in which the substrate 40 and the metal plate 60 are fixed to each other, stress may be generated in the substrate 40 and the metal plate 60.

As for the material properties, each material has a different coefficient of thermal expansion and thus there is a difference in the physical deformation of the material caused by heat. Particularly, the coefficient of thermal expansion of the metal material is greater than the coefficient of thermal expansion of the glass, and thus in response to the same heat applied to the substrate 40 and the metal plate 60, the metal plate 60 may be expanded and deformed more than the substrate 40.

Conversely, in response to the substrate 40 and the metal plate 60 being cooled after heat generation in the substrate 40 is terminated, the metal plate 60 may be contracted and deformed more than the substrate 40.

The substrate 40 and the metal plate 60 are in a state of being bonded to each other by the rear adhesive tape 61, and thus when the metal plate 60 is deformed more than the substrate 40, an external force may be transmitted to the substrate 40.

Conversely, an external force may be transmitted to the metal plate 60 by the substrate 40, but the substrate 40 may be damaged because the rigidity of the glass substrate 40 is less than the rigidity of the metal plate 60 formed of metal.

The rear adhesive tape 61 may be provided between the substrate 40 and the metal plate 60 to absorb external forces that is transmitted in different configurations while the substrate 40 and the metal plate 60 are expanded to different sizes.

Accordingly, it is possible to prevent the external force from being transmitted to the substrate 40 and the metal plate 60, and further to prevent the substrate 40 from being damaged.

The rear adhesive tape 61 may be formed of a material with high flexibility so as to absorb the external force transmitted from the substrate 40 and the metal plate 60. Particularly, the flexibility of the rear adhesive tape 61 may be greater than that of the substrate 40 and the metal plate 60.

Accordingly, in response to the external force, which is generated by the size change of the substrate 40 and the metal plate 60, being transmitted to the rear adhesive tape 61, the rear adhesive tape 61 itself may be deformed and thus the rear adhesive tape 61 may prevent the external force from being transmitted to different configurations.

The rear adhesive tape 61 may have a predetermined thickness in the first direction X. In response to the state of the rear adhesive tape 61 being expanded by the heat or being contracted, the metal plate 60 may be expanded or contracted in a direction perpendicular to the first direction X, as well as the first direction X and thus the external force may be transmitted to the substrate 40.

In response to the expansion or the contraction of the metal plate in the direction perpendicular to the first direction X, the thickness of the rear adhesive tape 61 may be changed and the external force may be prevented from being transmitted to the substrate 40. Further, the coefficient of thermal expansion of the rear adhesive tape 61 may be different from the coefficient of thermal expansion of the substrate 40 and the metal plate 60.

It is appropriate that the coefficient of thermal expansion of the rear adhesive tape 61 is greater than the coefficient of thermal expansion of the substrate 40 and less than the coefficient of thermal expansion of the metal plate 60.

Accordingly, the rear adhesive tape 61 may be deformed in a different way by both the substrate 40 and the metal plate 60 at the same temperature, and thus the rear adhesive tape 61 may ease the deformation of each configuration between the substrate 40 and the metal plate 60.

Therefore, the rear adhesive tape 61 may be arranged and deformed between the substrate 40 and the metal plate 60 to easily absorb the external force generated according to the difference in the coefficient of thermal expansion between the substrate 40 and the metal plate 60.

The rear adhesive tape 61 may be formed in a predetermined thickness or more. The predetermined thickness represents a minimum length that allows the rear adhesive tape 61 to be maintained in the state, in which the external force is not applied to the substrate 40, even in response to the deformation of the rear adhesive tape 61 caused by the thermal expansion of the metal plate 60 and the substrate 40.

The display module 30A may include the fixing member 82 provided to couple the frame 15 to the display module 30A.

The fixing member 82 may be arranged on the rear surface of the metal plate 60 to bond the metal plate 60 to the frame 15.

As described above, the metal plate 60 is formed to have a size corresponding to that of the substrate 40 and may be provided to cover the entire rear surface 43 of the substrate 40, and thus a fixing member 82 may be arranged on the rear surface of the metal plate 60.

However, the disclosure is not limited thereto, and the fixing member 82 may be provided to be arranged on the rear surface 43 of the substrate 40. In this case, the substrate 40 may be directly bonded to the frame 15 through the fixing member 82.

As another example, the metal plate 60 may be provided to cover a portion of the rear surface 43 of the substrate 40, and on the rear surface 43 of the substrate 40, the fixing member 82 may be bonded to a region that is not covered by the metal plate 60.

It is appropriate that the fixing member 82 is provided with a double-sided tape.

Hereinafter the front cover 70, a side cover 90, and the anisotropic conductive layer 47 will be described in detail.

Figure 8:
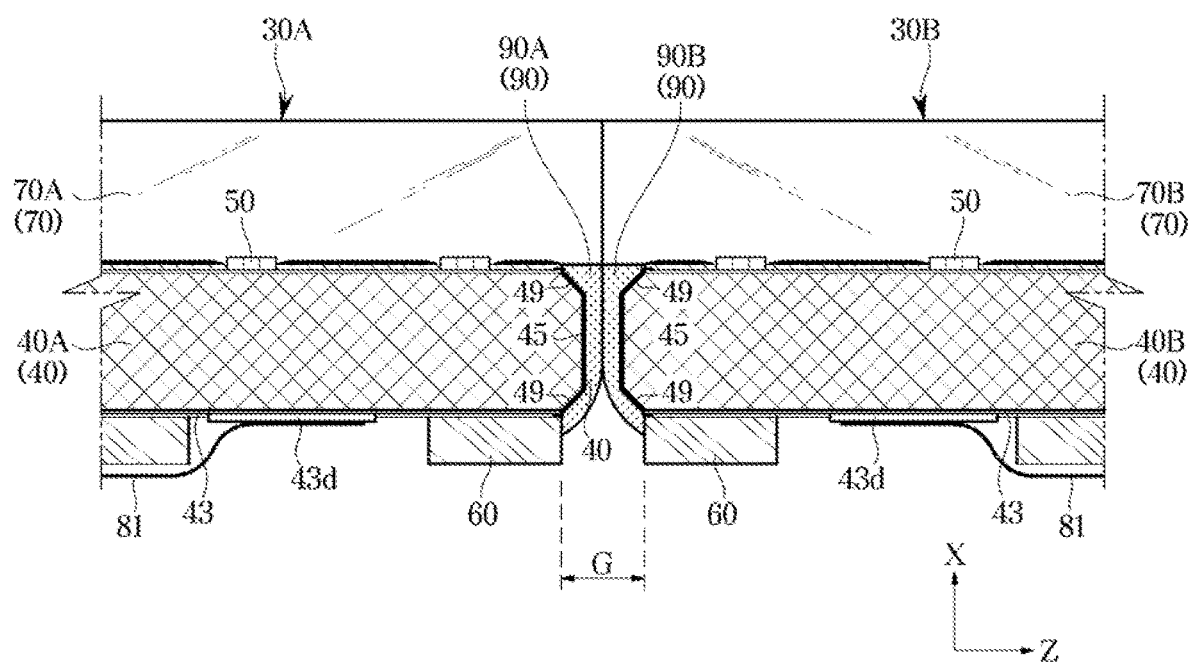
FIG. 8 is a cross-sectional view illustrating a part of the configuration of the display apparatus of FIG. 1 with respect to a third direction.
Figure 9:
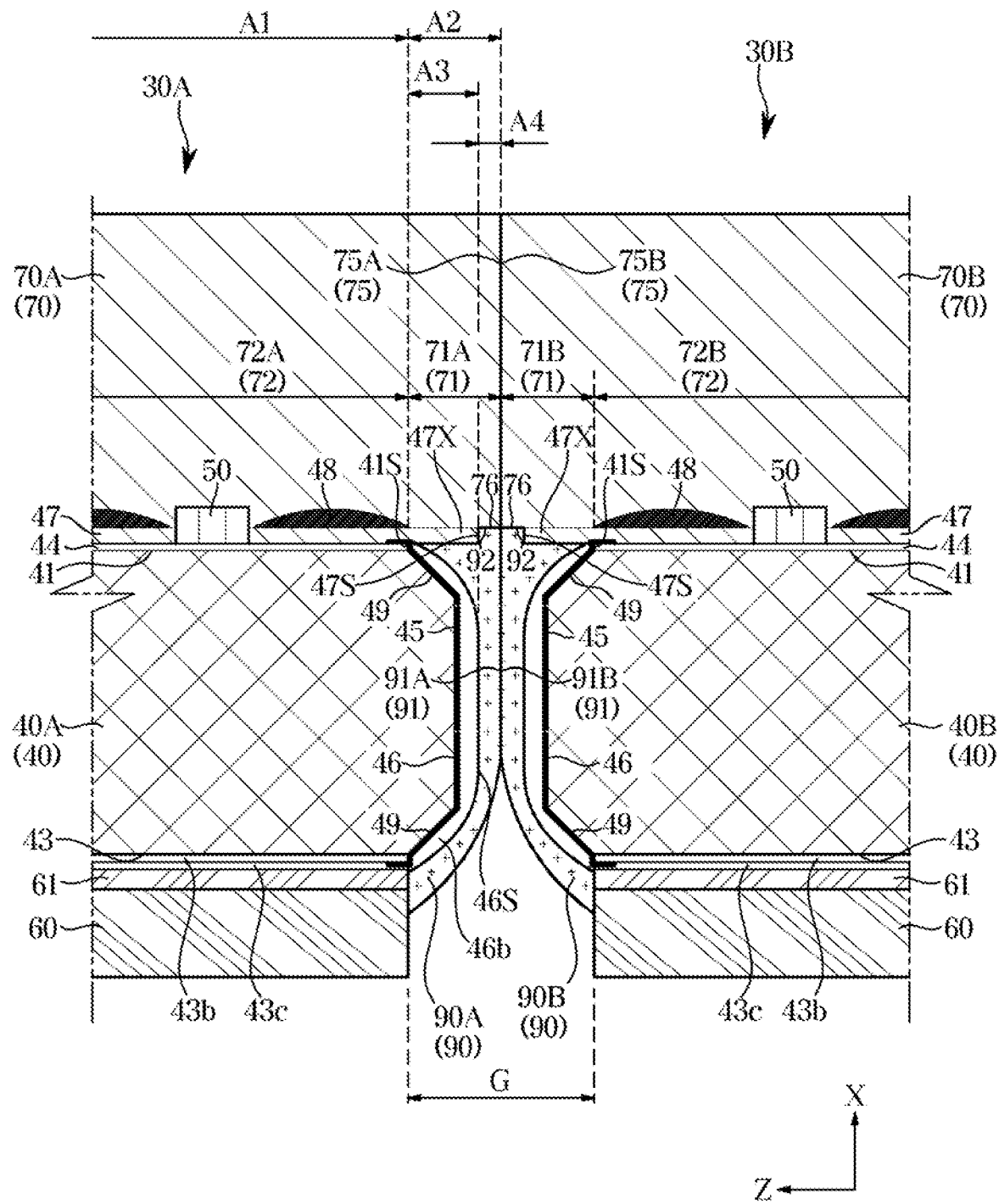
FIG. 9 is an enlarged cross-sectional view illustrating a part of the configuration shown in FIG. 8.
Figure 10:
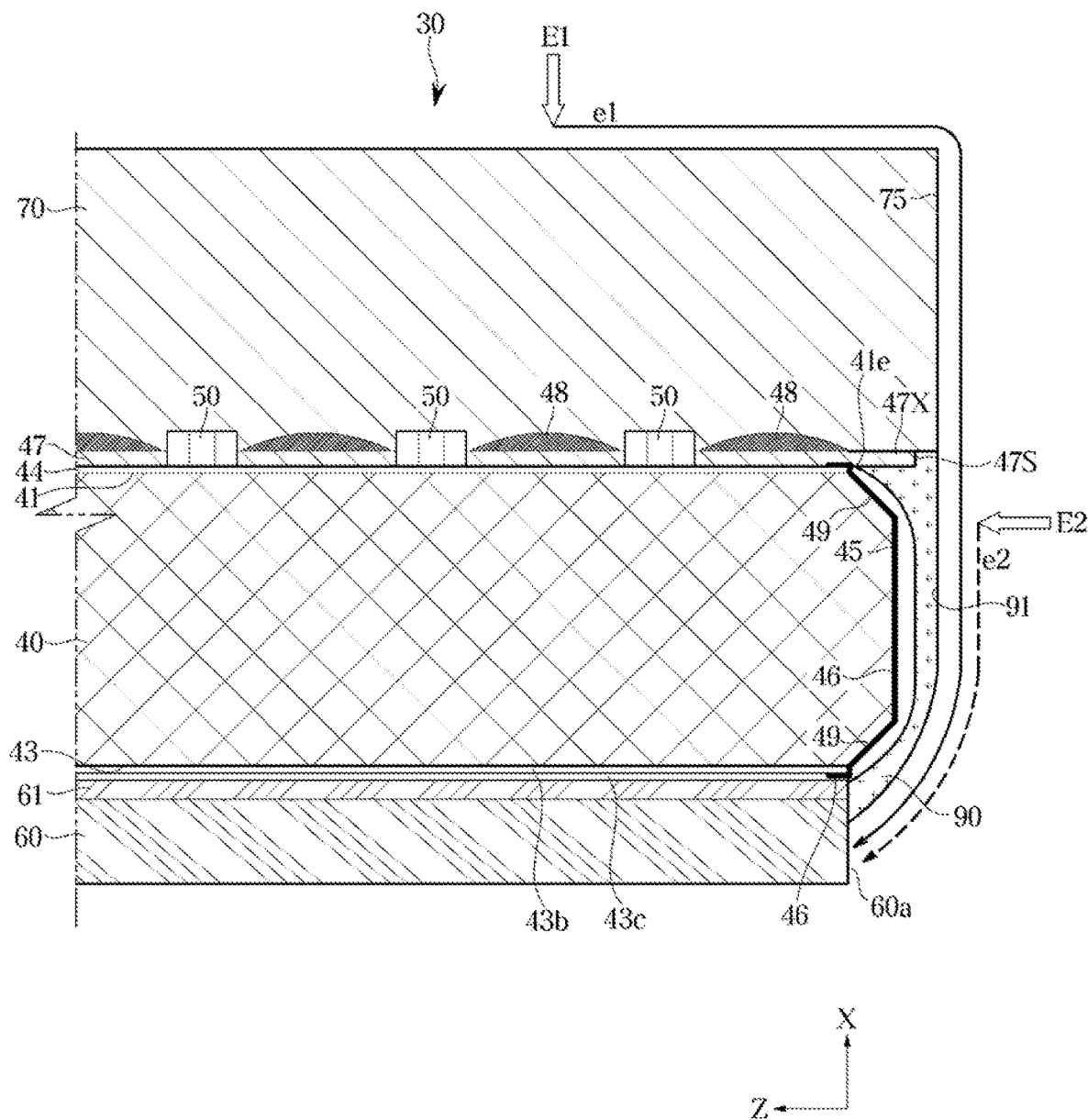
FIG. 10 is a view schematically illustrating an Electrostatic Discharge (ESD) flow of a part of the configuration of the display apparatus of FIG. 1.

FIG. 6 is a cross-sectional view illustrating a part of the configuration of the display apparatus of FIG. 1 with respect to a second direction, FIG. 7 is an enlarged cross-sectional view illustrating a part of the configuration shown in FIG. 6, FIG. 8 is a cross-sectional view illustrating a part of the configuration of the display apparatus of FIG. 1 with respect to a third direction, FIG. 9 is an enlarged cross-sectional view of a part of the configuration shown in FIG. 8, and FIG. 10 is a view schematically illustrating an Electrostatic Discharge (ESD) flow of a part of the configuration of the display apparatus of FIG. 1.

The front cover 70 may protect the substrate 40 from the external force, and may reduce the visibility of the seam formed by a gap G between adjacent ones of the plurality of display modules 30A-30P, and may reduce color deviation between the plurality of display modules 30A-30P.

The plurality of display modules 30A-30P may include the side cover 90 arranged in the gap G formed between the plurality of display modules 30A-30P in response to the array of the plurality of display modules 30A-30P.

The front cover 70 may be extended to the outside of the substrate 40 of the plurality of display modules 30A-30P so as to adsorb light reflected from the gap G between the plurality of display modules 30A-30P.

Particularly, the front cover 70 may be provided to extend to the outer side with respect to the edge (or side end) 41S of the mounting surface 41 of the substrate 40 in the second direction Y and the third direction Z (refer to FIGS. 5 and 6).

Substantially, the gap between the respective display modules 30A-30P may be generated between the side surfaces 45 of the substrate 40 of the respective display modules 30A-30P. However, according to an embodiment of the disclosure, the gap may mean a non-display region formed between the respective display modules 30A-30P, and it may be understood that the gap G formed between the plurality of display modules 30A-30P means separation from the side end 41S of the mounting surface 41 of the substrate 40 of the respective display modules 30A-30P to the side end 41S of the mounting surface 41 of the substrate 40 of the respective display modules 30A-30P that is adjacent thereto.

Therefore, the gap G formed between the plurality of display modules 30A-30P may mean separation from the side end 41S of the mounting surface 41 of the substrate 40 of the respective display modules 30A-30P to the side end 41S of the mounting surface 41 of the substrate 40 of the respective display modules 30A-30P that is adjacent thereto, in the second direction Y or the third direction Z.

The front cover 70 extending from each of the display modules 30A-30P may be arranged in (e.g., above in the direction X) the gap G between the plurality of display modules 30A-30P, and thus the front cover 70 may absorb light emitted to the gap G or light reflected from the gap G, thereby minimizing the recognition of the seam.

In addition, as will be described later, the light emitted to the gap G may be absorbed by the side cover 90 of the plurality of display modules 30A-30P arranged in the gap G, thereby minimizing the recognition of the seam.

As illustrated in FIGS. 6 and 7, the front cover 70 may be provided to extend to the outside of the substrate 40 in the second direction Y. Particularly, the front cover 70 may be provided to extend to the outer side with respect to the side surface 45 and the chamfer 49 in the second direction Y.

According to an embodiment of the disclosure, only one edge side of the substrate 40 corresponding to the right edge 31 of the first display module 30A has been described, but the front cover 70 may extend outward in the second direction Y or the third direction Z with respect to the four edges E of the substrate 40.

That is, a side end 75 of the front cover 70 corresponding to the edge of the front cover 70 may extend to the outside of the substrate 40 with respect to the four edges E of the substrate 40 in the second direction Y or the third direction Z (see, e.g., FIG. 7).

The front cover 70 may include a plurality of layers each having different optical properties. Each of the plurality of layers may be provided in a structure stacked in the first direction X.

The plurality of layers may be bonded in the first direction X to form the front cover 70.

Among the plurality of layers, one layer may be provided as an anti-glare layer. However, the disclosure is not limited thereto and may be provided as an anti-reflective layer or a layer in which an anti-glare layer and an anti-reflective layer are mixed.

Among the plurality of layers, other layer may be provided as a light transmittance control layer. However, the disclosure is not limited thereto and other layers may be formed of a layer including different physical properties or materials or having different functions. For example, another layer may be provided as a circular polarization layer.

In addition, the disclosure is not limited thereto and the plurality of layers may be provided as a single layer. A single layer may be provided as a layer configured to functionally implement all the functions of the plurality of layers.

As described above, the front cover 70 may include an adhesive layer. The adhesive layer may be arranged at the rearmost side of the plurality of layers in the first direction X and bonded to the mounting surface 41. The adhesive layer may be provided to have a predetermined height or more in the first direction X to which the mounting surface 41 or the light emitting surface 54 faces.

This is to sufficiently fill a gap that may be formed between the adhesive layer and the plurality of inorganic light emitting diodes 50 in response to bonding the adhesive layer to the substrate 40.

The disclosure is not limited thereto, and thus an adhesive layer may be provided as a component, which is separated from the front cover 70 and arranged between the front cover 70 and the mounting surface 41, thereby bonding the front cover 70 to the mounting surface 41.

Accordingly, the front cover 70 may be closely bonded to the mounting surface 41 so as to protect components mounted on the mounting surface 41 and thus the display module 30 may directly bond the front cover 70 to the substrate 40 without an additional molding structure between the front cover 70 and the substrate 40.

The front cover 70 may be provided to diffusely reflect light incident from the outside so as to prevent glare of the user that is caused by specular reflection of light incident from the outside.

The front cover 70 may diffusely reflect light incident from the outside and thus it is possible to reduce the glare and improve the contrast of the screen displayed on the display panel 20.

Further, the front cover 70 may be provided to reduce transmittance of incident external light or external light reflected from the substrate 40 and the gap G.

The front cover 70 according to an embodiment of the disclosure may include a material that reduces the transmittance of light, and absorb at least a portion of light transmitted toward the substrate 40 or at least a portion of light reflected from the substrate 40 in the first direction X.

Upon manufacturing the plurality of substrates, colors of some of the substrates may be different due to a difficulty in the production process. Accordingly, substrates having different unique colors may be tiled to form a single display panel.

As described above, the front cover 70 according to an embodiment of the disclosure absorbs at least a portion of the light that is reflected from the substrate 40 and transmitted to the outside, thereby increasing the sense of unity of the screen of the display panel 20.

That is, the front cover 70 may reduce the color deviation of each display module 30A-30P, which is generated in the production process of the plurality of display modules 30A-30P, by lowering the external light transmittance.

The front cover 70 may prevent external light, which is incident from the outside to the display panel 20, from being transmitted to the substrate 40, and additionally absorb a portion of light incident on the display panel 20 from the outside or a portion of light that is reflected from the substrate 40 and transmitted to the outside of the display panel 20. Therefore, the front cover 70 may improve the contrast of the screen display on the display panel 20. The different optical actions may be respectively implemented using the above-described plurality of layers.

That is, the front cover 70 may be arranged in front of the substrate 40 with respect to the first direction X to improve the contrast that may be reduced by external light in the screen displayed on the display panel 20.

As described above, in the display module 30 according to an embodiment of the disclosure, the front cover 70 may be provided to extend to the outside of the substrate 40 in the second direction Y.

Accordingly, a portion of the light introduced into the gap G formed between the plurality of display modules 30A-30P may be blocked by at least a portion of the front cover 70 arranged in the gap G, and at least a portion of external light introduced into the gap G or external light reflected from the gap G may be absorbed by the front cover 70, and thus the light may be not transmitted to the outside. Therefore, it is possible to reduce the visibility of the seam formed in the gap G, and thus it is possible to increase the sense of unity of the screen displayed on the display panel 20 due to the reduction of the visibility of the seam.

Particularly, the side end 75 of the front cover 70 in the second direction Y may be arranged outside the side end 41S of the mounting surface 41 or in the gap G in the second direction Y.

Accordingly, the front cover 70 may include a first region 71 arranged on the outer side with respect to the side end 41S of the mounting surface 41 or in the gap G in the second direction Y, and a second region 72 arranged on the mounting surface 41 in the second direction Y as shown in FIG. 7.

The first region 71 and the second region 72 of the front cover 70 may be partitioned in the second direction Y by the gap G.

The first region 71 of the front cover 70 may be arranged in the gap G and thus external light emitted to the gap G may be blocked by the first region 71 of the front cover 70 and light reflected from the gap G may be prevented from being emitted to the outside. Therefore, it is possible to reduce the visibility of the seam, which is a boundary between the plurality of display modules 30A-30P and generated by the gap G, and thus it is possible to improve the sense of unity of the display panel 20.

The front cover 70 may be provided to extend to the outer side than the four edges 41S of the mounting surface 41 of the substrate 40 as described above, and thus the visibility of the seam, which is formed at each edge of the plurality of display modules 30A-30P, may be reduced.

When the first display module 30A and the second display module 30E are described as an example, a first region 71A of the first front cover 70A extending from the first display module 30A may be arranged in the gap G formed between the first display module 30A and the second display module 30E.

Side ends 75A and 75E, which are adjacent to each other, of the front covers 70A and 70E of the first and second modules 30A and 30E may be arranged in the gap G.

In addition, the side surface 45 and the chamfer 49 of the first and second display modules 30A and 30E may be arranged in the gap G.

The second region 72A of the first front cover 70A may be arranged on the mounting surface 41 of the first display module 30A.

The first region 71E of the second cover 70E extending from the second display module 30E may be arranged in the gap G formed between the first display module 30A and the second display module 30E. The second region 72E of the second front cover 70E may be arranged on the mounting surface 41 of the second display module 30E.

That is, in the gap G formed between the first display module 30A and the second display module 30E, the first regions 71A and 71E of the first and second front covers 70A and 70E may be arranged side by side in the second direction Y.

A length in which the first regions 71A and 71E of the first and second front covers 70A and 70E extend in the second direction Y may be approximately less than or equal to half of the gap G.

Accordingly, in response to the first regions 71A and 71E of the first and second front covers 70A and 70E being arranged side by side in the second direction Y, the sum of the lengths of the first regions 71A and 71E may be provided to be approximately less than or equal to the length of the gap G.

According to an embodiment of the disclosure, in response to the first regions 71A and 71E of the first and second front covers 70A and 70E being arranged side by side in the second direction Y, predetermined separation may be formed between the side end 75A of the first cover 70A and the side end 75E of the second cover 70E.

However, the separation may be a relatively small value and thus may be negligible. Therefore, the first display module 30A and the second display module 30E may be tiled substantially without large separation between the first region 71A of the first front cover 70A and the first region 71E of the second cover 70E.

As described above, in the gap G between the first display module 30A and the second display module 30E, the first region 71A of the first front cover 70A and the first region 71E of the second front cover 70E may be arranged.

External light incident on the display panel 20 may be diffusely reflected to the outside of the display panel 20 or partially absorbed to the first regions 71A and 71E while passing through the first regions 71A and 71E of the first and second front covers 70A and 70E. Accordingly, an amount of light reaching the gap G may be reduced, and the visibility of the boundary between the first display module 30A and the second display module 30E due to the gap G may be reduced.

In addition, the light reflected from the gap G and directed to the outside of the display panel 20 may be diffusely reflected to the outside of the display panel 20 or partially absorbed by the first regions 71A and 71E while passing through the first regions 71A and 71E of the first and second front covers 70A and 70E. Accordingly, an amount of light that is transmitted to the outside of the display panel 20 may be reduced, and the visibility of the boundary between the first display module 30A and the second display module 30E due to the gap G may be reduced.

That is, it is possible to absorb at least a portion of external light reflected from the gap G while reducing the amount of light introduced into the gap G formed between the plurality of display modules 30A-30P. Accordingly, it is possible to improve the sense of unity of the screen of the display panel 20.

Additionally, even if the substrate 40A of the first display module 30A and the substrate 40E of the second display module 30E have different colors, at least a portion of the light, which is reflected when each of the substrates 40A and 40E is displayed to the outside by the reflection of the external light, may be absorbed to the first and second front covers 70A and 70E and thus the unique color of each of the substrates 40A and 40E may be not recognized to the outside. Therefore, it is possible to improve the sense of unity of the screen of the display panel 20.

The display module 30A may include the side cover 90 arranged under the front cover 70 in a direction, to which the mounting surface 41 faces, and provided on the side surface 45 of the substrate 40.

Particularly, the side cover 90 may be arranged in a space formed on a lower surface 76 of the first region 71 of the front cover 70 in the first direction X and the side surface of the substrate 40 in the second direction Y.

The side cover 90 may be bonded to the lower surface 76 of the first region 71, the side surface 45 and at least a portion of the metal plate 60. It is appropriate that the side cover 90 is provided to be bonded to the entire lower end 76 of the first region 71. Further, it is appropriate that the side cover 90 is provided to cover the entire region of the side surface 45.

The lower surface 76 of the first region 71 may correspond to the entire lower surface of the enter front cover 70 and represent an adhesive layer formed at the rearmost end of the front cover 70.

In addition, the side cover 90 may be provided to cover all of the pair of chamfers 49 arranged in the front and rear direction of the side surface 45 in the first direction X (see, e.g., FIG. 7).

The side cover 90 may be provided to surround the entire chamfer 49 formed between the mounting surface 41 and the side surface 45, as well as the side surface 45.

The side cover 90 is provided to surround the chamfer 49 formed between the mounting surface 41 and the side surface 45 and thus the side cover 90 may fill all space formed between the substrate 40 and the front cover 70.

Accordingly, the side cover 90 may prevent foreign substances or moisture from entering the space between the substrate 40 and the front cover 70 from the outside.

In addition, because the side cover 90 is provided to surround the chamfer 49 formed between the rear surface 43 and the side surface 45, the side cover 90 may fill all space formed between the substrate 40 and the metal plate 60.

Accordingly, the side cover 90 may prevent foreign substances or moisture from entering the space between the substrate 40 and the metal plate 60 from the outside.

The side cover 90 may be provided to be in contact with the lower surface 76 of the first region 71 and the chamfer 49 and the side surface 45 of the substrate 40. Accordingly, the side cover 90 may support the lower surface 76 of the first region 71 and the chamfer 49 and the side surface 45 of the substrate 40.

As described above, the front cover 70 and the substrate 40 are bonded to each other, and the adhesiveness of the front cover 70 and the substrate 40 may be increased by the side cover 90. Accordingly, the side cover 90 may prevent the front cover 70 from being separated from the substrate 40.

That is, the reliability of the display module 30A may be increased by the side cover 90.

In addition, the substrate 40 and the metal plate 60 are bonded to each other by the rear adhesive tape 61, and the adhesiveness between the metal plate 60 and the substrate 40 may be increased by the side cover 90. Accordingly, the side cover 90 may prevent the metal plate 60 from being separated from the substrate 40.

As described above, the side surface 45 of the substrate 40 may be provided to correspond to the four edges 41S of the mounting surface 41, and the first region 71 of the front cover 70 may extend to the outer side with respect to the four edges 41S of the mounting surface 41 in the second direction Y and in the third direction Z in which the mounting surface 41 is extended.

The side cover 90 may be provided to contact an entirety of the lower surface 76 of the first region 71 and to surround the side surface 45 corresponding to the four edges 41S of the mounting surface 41 along the circumference of the four edges 41S of the mounting surface 41.

That is, the side cover 90 may be provided to seal the entire edge of the portion where the substrate 40 and the front cover 70 are bonded to each other.

The side cover 90 may cover the lower surface 76 of the first region 71 and the side surface 45 in all directions perpendicular to the first direction X.

Accordingly, the coupling between the front cover 70 and the substrate 40 may be improved, and the side cover 90 may protect the front cover 70 and the side surface 45 of the substrate 40 from external forces.

In addition, as described above, the side cover 90 may prevent external moisture or foreign substances from entering between the substrate 40 and the front cover 70. Additionally, even when space is formed between the substrate 40 and the front cover 70 due to an adhesive difficulty, the side cover 90 may prevent external moisture or foreign substances from entering the space.

The side cover 90 may be provided to surround all four edges E of the substrate 40 along the side surface 45 of the substrate 40 and thus it is possible to seal among the substrate 40 and the front cover 70 and the metal plate 60.

Accordingly, the side cover 90 may prevent foreign substances or moisture from entering between the substrate 40 and the front cover 70 even when foreign substances or moisture enter the substrate 40 in any direction.

As described above, because the rearmost end of the front cover 70 in the first direction X is provided as an adhesive layer, the lower surface 76 of the first region 71 may be provided as a rear surface of the adhesive layer.

Accordingly, in response to the lower surface 76 of the first region 71 being exposed to the outside, foreign substances flowing from the outside may adhere to the lower surface 76 of the first region 71.

In response to the array of the plurality of display modules 30A-30P in a state in which the foreign substances adhere to the lower surface 76 of the first region 71, the recognition of the seam between the plurality of display modules 30A-30P may be increased by the foreign substances adhering to the lower surface 76 of the first region 71.

However, the display module 30A according to an embodiment of the disclosure includes the side cover 90, and the side cover 90 is provided to cover the lower surface 76 of the first region 71. It is possible to prevent the foreign substances from adhering to the lower surface 76 of the first region 71.

Accordingly, foreign substances may adhere to the front cover 70 when the plurality of display modules 30A-30P is arrayed, and thus it is possible to reduce the recognition of the seam generated between the plurality of display modules 30A-30P.

As will be described later, due to the electrostatic discharge that may occur on the display modules 30A-30P, the current may flow into the plurality of electrical components mounted on the substrate 40 and thus the electrical components may be damaged. However, the side cover 90 may seal the substrate 40 from the outside to prevent damage to the electrical components, thereby preventing the electric charges generated by the electrostatic discharge from flowing into the substrate 40.

That is, the substrate 40 is sealed by the front cover 70 and the side cover 90 and thus the electric charges generated by the electrostatic discharge do not pass through the front cover 70 and the side cover 90. Accordingly, it is possible to prevent the electric charges from passing through the substrate 40 and to guide the electric charges, which flow on the front cover 70 and the side cover 90, to the metal plate 60 in contact with the side cover 90, thereby providing a path of the current generated by the electrostatic discharge. Accordingly, the ESD withstand voltage of the electrical components mounted on the substrate 40 may be improved.

As described above, the side cover 90 may be provided to be arranged under the front cover 70 in a direction to which the mounting surface 41 faces. That is, the side cover 90 is not arranged above the lower surface 76 in the first direction X.

A frontmost surface 92 of the side cover 90 in the first direction X may be provided in contact with the lower surface 76 of the first region 71, and may not be arranged above the lower surface 76 of the first region 71 in the first direction X.

This is to prevent the side cover 90 from being arranged on a movement path of the light emitted from the plurality of inorganic light emitting diodes 50.

In response to at least a portion of the side cover 90 being arranged in front of the lower surface 76 or in front of the front cover 70 in the first direction X, the at least a portion of the side cover 90 may be arranged on the path of light moving forward through the front cover 70.

That is, the side cover 90 may absorb or diffusely reflect a portion of light and thus a region of image displayed on the display module 20 may be distorted.

However, the side cover 90 according to an embodiment of the disclosure is arranged behind the front cover 70 in the first direction X, and thus the side cover 90 may not restrict the movement of light emitted by the plurality of inorganic light emitting diodes 50. Therefore, the image quality of the display module 20 may be improved.

The side end 75 of the front cover 70 in the second direction Y and a side end 91 of the side cover 90 in the second direction Y may be arranged on substantially the same line in the first direction X (e.g., the side end 75 and the side end 91 may be coplanar).

As will be described later, this is because the front cover 70 and the side cover 90 are simultaneously cut in the manufacturing process of the display module 30A. In addition, with reference to FIG. 18, a side end member 100 may be bonded to the side end 75 of the front cover 70 and the side end 91 of the side cover 90 that are arranged on the substantially same line in the first direction X.

That is, separation formed between the plurality of display modules 30A-30P in response to the array of the plurality of display modules 30A-30P may be minimized, and the seam recognized through the separation between the plurality of display modules 30A-30P may be minimized.

The side cover 90 may include a material that absorbs light. For example, the side cover 90 may be formed of an opaque or translucent material.

Further, the side cover 90 may include a photosensitive material. For example, the side cover 90 may be formed of a photosensitive optical clear resin (OCR). In response to the external light having a wavelength other than that of visible light such as ultraviolet (UV) light, physical properties of the photosensitive material may be changed, and the color of the photosensitive material may be changed to a dark color.

Accordingly, the side cover 90 may be provided as a material that is colored to a dark color in response to the emission of the UV light to the side cover 90 during the manufacturing process, so as to absorb light.

The side cover 90 may have a dark color. The side cover 90 may have a darker color than the front cover 70.

It is appropriate that the side cover 90 has a color similar to that of the black matrix 48.

Accordingly, light incident on the side cover 90 may be absorbed by the material, which absorbs the light, of the side cover 90 without being reflected.

The side cover 90 may be arranged in the gap G formed between the plurality of display modules 30A-30P together with the first region 71 of the front cover 70 when the plurality of display modules 30A-30P is arrayed.

Accordingly, it is possible to absorb the light introduced into the gap G so as to minimize light that is introduced into the gap G and reflected toward the outside. Accordingly, it is possible to reduce the visibility of the seam formed by the gap G formed between the plurality of display modules 30A-30P.

When the first display module 30A and the second display module 30E are described as an example, a first side cover 90A of the first display module 30A and a second side cover 90E of the second display module 30E may be arranged in the gap G formed between the first display module 30A and the second display module 30E together with the first region 71A of the first cover 70A and the first region 71E of the second cover 70E.

The adjacent side ends 75A and 75E of the front covers 70A and 70E and the adjacent side ends 91A and 91E of the side covers 90A and 90E of the first and second display modules 30A and 30E may be arranged in the gap G.

The adjacent side ends 75A and 75E of the front covers 70A and 70E and the adjacent side ends 91A and 91E of the side covers 90A and 90E may be arranged to face each other. It is appropriate that the adjacent side ends 75A and 75E of the front covers 70A and 70E and the adjacent side ends 91A and 91E of the side covers 90A and 90E may be arranged in parallel to each other.

That is, in the gap G formed between the first display module 30A and the second display module 30E, the first regions 71A and 71E of the first and second front covers 70A and 70E and the first and second side covers 90A and 90E may be arranged side by side in the second direction Y.

A length of the first and second side covers 90A and 90E extending in the second direction Y may be provided in approximately less than or equal to half of the gap G in accordance with the first regions 71A and 71E of the first and second front covers 70A and 70E.

In the gap G formed between the first display module 30A and the second display module 30E, the first region 71A of the first front cover 70A and the first region 71E of the second front cover 70E may be arranged, and the first and second side covers 90A and 90E may be arranged behind each of the first regions 71A and 71E in the first direction X.

As described above, the external light incident on the display panel 20 is diffusely reflected to the outside of the display panel 20 or partially absorbed while passing through the first regions 71A and 71E of the first and second front covers 70A and 70E. Accordingly, the amount of light reaching to the gap G may be reduced.

Further, even if a portion of light reaches the gap G, the light introduced into the gap G is absorbed by the first and second side covers 90A and 90E, which are arranged in the gap G, and thus the visibility of the boundary between the first display module 30A and the second display module 30E may be reduced.

That is, it is possible to additionally absorb the light reaching the gap G while reducing the amount of external light introduced into the gap G formed between the plurality of display modules 30A-30P. Accordingly, it is possible to improve the sense of unity of the screen of the display panel 20.

Light, which is not absorbed by the first and second side covers 90A and 90E and which is reflected on the first and second side covers 90A and 90E and directed to the outside of the display panel 20, may be diffusely reflected to the outside of the display panel 20 or partially absorbed in the first regions 71A and 71E while passing through the first and second front covers 70A and 70E. Accordingly, an amount of light transmitted to the outside of the display panel 20 may be reduced and the visibility of the boundary between the first display module 30A and the second display module 30E due to the gap G may be reduced.

As described above, the side cover 90 may be arranged in the gap G formed between the plurality of display modules 30A-30P in response to the array of the plurality of display modules 30A-30P, and thus the side cover 90 may absorb light reaching the gap G so as to reduce the recognition of the seam caused by the gap G.

In the above-described example, the front cover 70 is provided to reduce the amount of light reaching the substrate 40 by diffusely reflecting, absorbing, circularly polarizing, or changing the reflection direction of a portion of the light introduced into the display module 20.

However, the disclosure is not limited thereto, and the front cover 70 may be formed of a transparent material through which light is transmitted without deformation. Even in this case, the visibility of the boundary between the plurality of display modules 30A-30P due to the gap G may be reduced by the side cover 90 arranged between the plurality of display modules 30A-30P.

As described above, the side cover 90 may be formed of a material that absorbs light, and based on at least a portion of the side cover 90 being arranged in front of the front cover 70 in the first direction X, a portion of the light emitted from the inorganic light emitting diodes 50 may be absorbed. Accordingly, a difficulty in that a part of the screen displayed on the display module 20 is darkly displayed may occur.

However, the side cover 90 according to an embodiment of the disclosure is arranged under the front cover 70 in the first direction X, particularly, under the lower surface 76 of the first region 71. The side cover 90 may not absorb light emitted from the plurality of inorganic light emitting diodes 50, and thus the brightness of the image displayed on the display module 20 may be uniform.

As illustrated in FIGS. 8 and 9, the front cover 70 may be provided to extend to the outside of the substrate 40 in the third direction Z. Particularly, the front cover 70 may be provided to extend to the outer side than the side surface 45 and the chamfer 49 in the third direction Z.

The side end 75 of the front cover 70 in the third direction Z may be arranged outside the side end 41S of the mounting surface 41 or in the gap G in the third direction Z.

The first region 71 and the second region 72 of the front cover 70 described above may be partitioned in the third direction Z by the gap G.

When the first display module 30A and the third display module 30B are descried as an example, the first region 71A of the first front cover 70A extending from the first display module 30A may be arranged in the gap G formed between the first display module 30A and the third display module 30B.

The adjacent side ends 75A and 75B of the front covers 70A and 70B of the first and third display modules 30A and 30B may be arranged in the gap G.

Further, the side surface 45 and the chamfer 49 of the first and third display modules 30A and 30B may be arranged in the gap G.

A first region 71B of the third front cover 70B extending from the third display module 30B may be arranged in the gap G formed between the first display module 30A and the third display module 30B. A second region 72B of the third front cover 70B may be arranged on the mounting surface 41 of the third display module 30B.

That is, in the gap G formed between the first display module 30A and the third display module 30B, the first regions 71A and 71B of the first and third front covers 70A and 70B may be arranged side by side in the third direction Z.

External light incident into the display panel 20 may be diffusely reflected to the outside of the display panel 20 or partially absorbed by the first regions 71A and 71B while passing through the first regions 71A and 71B of the first and third front covers 70A and 70B. Accordingly, an amount of light reaching the gap G may be reduced and thus the visibility of the boundary between the first display module 30A and the third display module 30B due to the gap G may be reduced.

Light, which is reflected on the gap G and directed to the outside of the display panel 20, may be diffusely reflected to the outside of the display panel 20 or partially absorbed by the first regions 71A and 71B while passing through the first regions 71A and 71B of the first and third front covers 70A and 70B. Accordingly, an amount of light transmitted to the outside of the display panel 20 may be reduced and thus the visibility of the boundary between the first display module 30A and the third display module 30B by the gap G may be reduced.

As described above, the side cover 90 may be arranged in a space formed on the side surface of the substrate 40 in the third direction Z as well as the second direction Y.

The side wiring 46 may be arranged on the side surface 45 of the substrate 40 arranged in the third direction Z. Accordingly, the side cover 90 provided on the side surface 45 arranged toward the third direction Z may be provided to cover not only the side surface 45 and the chamfer 49, but also the side wiring 46. Therefore, the side cover 90 may protect the side wiring 46 from external force and prevent foreign substances or moisture from entering the side wiring 46.

That is, the side cover 90 may cover an entirety of the lower surface 76 of the first region 71 and may surround the side surface 45 corresponding to the four edges 41S of the mounting surface 41 along the circumference of the four edges 41S of the mounting surface 41. Accordingly, the side cover 90 may surround the side wiring 46 extending along the side surface 45 in the third direction Z.

Accordingly, the coupling between the front cover 70 and the substrate 40 may be improved, and the side cover 90 may protect the front cover 70, the side surface 45 and the side wiring 46 of the substrate 40 from external forces.

The side end 75 of the front cover 70 in the third direction Z and the side end 91 of the side cover 90 in the third direction Z may be arranged on the same line in the first direction X (e.g., the side end 75 and the side end 91 may be coplanar). It is appropriate that the side end 75 of the front cover 70 and the side end 91 of the side cover 90 may be arranged on the same line in a direction parallel to the first direction X.

When the first display module 30A and the third display module 30B are descried as an example, the first side cover 90A of the first display module 30A and the third side cover 90B of the third display module 30B may be arranged in the gap G formed between the first display module 30A and the third display module 30B together with the first region 71A of the first front cover 70A and a third region 71B of the third front cover 70B.

The adjacent side ends 75A and 75B of the front covers 70A and 70B and the adjacent side ends 91A and 91B of the side covers 90A and 90B of the first and third display modules 30A and 30B may be arranged in the gap G.

The adjacent side ends 75A and 75B of the front covers 70A and 70B and the adjacent side ends 91A and 91B of the side covers 90A and 90B may be arranged to face each other.

It is appropriate that the adjacent side ends 75A and 75B of the front covers 70A and 70B and the adjacent side ends 91A and 91B of the side covers 90A and 90B may be arranged parallel to each other.

That is, in the gap G formed between the first display module 30A and the third display module 30B, the first regions 71A and 71B of the first and third front covers 70A and 70B and the first and third side covers 90A and 90B may be arranged side by side in the third direction Z.

The side end 75 of the front cover 70 and the side end 91 of the side cover 90 and the side end 91 of the side cover 90 in the third direction Z may be formed on the same line in the first direction X. The side end member 100 may be bonded to the side end 75 of the front cover 70 and the side end 91 of the side cover 90 in the third direction Z (see, e.g., FIG. 18), and thus it is possible to minimize separation formed between the first and third display modules 30A and 30B in response to the array of the first and third display modules 30A and 30B.

In the gap G formed between the first display module 30A and the third display module 30B, the first regions 71A and 71B of the first and third front covers 70A and 70B and the first and third side covers 90A and 90B may be arranged side by side in the third direction Z.

In the gap G formed between the first display module 30A and the third display module 30B, the first region 71A of the first front cover 70A and the first region 71B of the third front cover 70B may be arranged, and the first and third side covers 90A and 90B may be arranged behind each of the first regions 71A and 71B in the first direction X.

As described above, external light incident on the display panel 20 may be diffusely reflected to the outside of the display panel 20 or partially absorbed while passing through the first regions 71A and 71B of the first and third front covers 70A and 70B. Accordingly, an amount of light that reaches the gap G may be reduced.

In addition, even when a portion of the light reaches the gap G, the light may be absorbed to the first and third side covers 90A and 90B formed in the gap G, and thus the visibility of the boundary between the first display module 30A and the third display module 30B may be reduced.

Light, which is not absorbed by the first and third side covers 90A and 90B and is reflected on the first and third side covers 90A and 90B and directed to the outside of the display panel 20, may be diffusely reflected to the outside of the display panel 20 or partially absorbed in the first regions 71A and 71B while passing through the first regions 71A and 71B of the first and third front covers 70A and 70B. Accordingly, an amount of light transmitted to the outside of the display panel 20 may be reduced and thus the visibility of the boundary between the first display module 30A and the third display module 30B due to the gap G may be reduced.

Hereinafter an extended length of a side end 47S of the anisotropic conductive layer 47 will be described in detail.

As described above, the anisotropic conductive layer 47 may be provided in the shape of an anisotropic conductive film. Although the anisotropic conductive layer 47 will be described in detail later, the anisotropic conductive layer 47 may be provided to be in the form of a film and bonded to the TFT 41.

The anisotropic conductive layer 47 may be formed in a film shape, and thus an area of the anisotropic conductive layer 47 may be greater than an area of the substrate 40.

Accordingly, after the anisotropic conductive layer 47 is bonded to the TFT layer 41, a process of cutting the anisotropic conductive layer 47 may be performed to allow the area of the anisotropic conductive layer 47 to correspond to the area of the substrate 40.

In the cutting process, the anisotropic conductive layer 47 may be cut to allow the area of the anisotropic conductive layer 47 to correspond to the area of the substrate 40 through laser cutting.

It is appropriate that the anisotropic conductive layer 47 is provided with the area corresponding to the area of the mounting surface 41. However, as described above, because the anisotropic conductive layer 47 is formed of an anisotropic conductive film, it is not easy to allow the area of the anisotropic conductive film to correspond to the area of the mounting surface 41. Further, in response to bonding the anisotropic conductive film corresponding the area of the mounting surface 41 to the mounting surface 41, the anisotropic conductive film may have a smaller cross-section than the mounting surface 41 due to manufacturing tolerances of the anisotropic conductive film. Therefore, the reliability of the display module 30 may be reduced.

Accordingly, the anisotropic conductive film having an area greater than the area of the mounting surface 41 may be bonded to the substrate 40, and then the anisotropic conductive film may be cut to an area corresponding to the area of the substrate 40, thereby forming the anisotropic conductive layer 47.

The side surface 45 may be arranged outside the mounting surface 41 by way of the chamfer 49. In this case, it is appropriate that the anisotropic conductive film is cut in the second direction Y with respect to the side surface 45 of the substrate 40 and cut in the third direction Z with respect to a side end 46S of the side wiring 46.

This is because in response to cutting the anisotropic conductive film with respect to the mounting surface 41, the side surface 45, the chamfer 49, or the side wiring 46 of the substrate 40 may be damaged.

Accordingly, in response to cutting the anisotropic conductive film, the side end 47S of the anisotropic conductive layer 47 may be arranged on an outer region of the mounting surface 41. Particularly, as described above, the anisotropic conductive film is cut based on the side end 46S of the side surface 45 or the side wiring 46, and thus it is appropriate that with respect to the first direction X, the side end 47S of the anisotropic conductive layer 47 is arranged on the same line as the side surface 45 or the side end 46S of the side wiring 46 (e.g., the side end 47S is coplanar with the side surface 45 or the side end 46S). In addition, the side end 47S of the anisotropic conductive layer 47 may be arranged on the outer side with respect to the side surface 45 or the side end 46S of the side wiring 46 due to burrs formed on the anisotropic conductive film during cutting, or due to a process tolerance.

However, in order to substantially prevent damage to the substrate 40 that may occur in the cutting process, a cutting position of the anisotropic conductive film may be a region outside the side surface 45 or the side end 46S of the side wiring 46.

Accordingly, the side end 47S of the anisotropic conductive layer 47 may be formed outside the substrate 40. Particularly, the side end 47S of the anisotropic conductive layer 47 may be arranged on the outer side with respect to the side cover 90.

In response to the anisotropic conductive layer 47 being arranged on the outer side with respect to the side cover 90, the side end 47S of the anisotropic conductive layer 47 may be arranged in the gap G between the plurality of display modules 30A-30P. Accordingly, the side end 47S of the anisotropic conductive layer 47 may be recognized as a seam between the plurality of display modules 30A-30P, and thus the sense of unity of the screen displayed on the display panel 20 may be reduced.

In addition, a current generated by the electrostatic discharge is introduced into the display module through the side end 47S of the anisotropic conductive layer 47, thereby causing the damage of the electrical components mounted inside the display module.

That is, the side end 47S of the anisotropic conductive layer 47 may be exposed to the outside, and in response to the electrostatic discharge around the display module 30, the high voltage electricity may be introduced into the inside of the display module 30 through the side end 47S of the anisotropic conductive layer 47, thereby causing the damage of the display module 30.

In the display apparatus 1 according to an embodiment of the disclosure, in order to prevent the damage of the display module 30, the side end 47S of the anisotropic conductive layer 47 may be arranged on the inner side with respect to the side end 75 of the front cover 70 as shown in FIGS. 7 and 9. Particularly, the side end 47S of the anisotropic conductive layer 47 may be arranged on the first region 71.

Accordingly, a region 47X, which extends to a region outside the mounting surface 41 of the substrate 40, in the anisotropic conductive layer 47 may be provided to extend to the first region 71.

As described above, the display module 30 includes the side cover 90 arranged on the outside of the substrate 40, and even when the side end 47S of the anisotropic conductive layer 47 is arranged on the outside of the substrate 40, the side end 47S of the anisotropic conductive layer 47 may be covered by the side cover 90.

Because the anisotropic conductive layer 47 is provided not to be exposed to the outside by the side cover 90, it is possible to prevent the recognition of the seam caused by the side end 47S of the anisotropic conductive layer 47, and to prevent the current from entering the side end 47S of the anisotropic conductive layer 47.

That is, even when the side end 47S of the anisotropic conductive layer 47 is arranged in the region outside the substrate 40, the side end 47S of the anisotropic conductive layer 47 may be covered by the side cover 90 and thus it is possible to prevent the above-mentioned difficulties. However, in response to the side end 47S of the anisotropic conductive layer 47 extending to the outside of the side cover 90, the side end 47S of the anisotropic conductive layer 47 may be exposed to the outside of the display module 30. Therefore, the side end 47S of the anisotropic conductive layer 47 may be arranged on the inner side with respect to the side end 91 of the side cover 90.

As described above, the side end 91 of the side cover 90 may be provided on the same line as (e.g., coplanar with) the side end 75 of the front cover 70, and thus the side end 47S of the anisotropic conductive layer 47 may be arranged on the inner side with respect to the side end 75 of the front cover 70.

Particularly, when it is assumed that a region corresponding to the first region 71 of the front cover 70 is defined as a first position region A2, and a region corresponding to the second region 72 of the front cover 70 is defined as a second position region A1, and when it is assumed that, with respect to the second direction Y in the first position region A2, a region between the side end 41S of the mounting surface 41 and the side surface 45 is defined as a third position region A3, and a region between the side end 91 of the side cover 90 and the side surface 45 is defined as a fourth position region A4, the side end 47S of the anisotropic conductive layer 47 in the second direction Y may be arranged in the fourth position region A4. In other words, edges of the anisotropic conductive layer 47 may protrude from side surfaces 45 of the substrate 40 and from a mounting surface 41 of the substrate 40, and edges of the front cover 70 may protrude from the edges of the anisotropic conductive layer 47.

Further, when it is assumed that, with respect to the third direction Z in the first position region A2, a region between the side end 41S of the mounting surface 41 and the side end 46S of the side wiring 46 is defined as a third position region A3, and a region between the side end 46S of the side wiring 46 and the side end 91 of the side cover 90 is defined as a fourth position region A4, the side end 47S of the anisotropic conductive layer 47 in the third direction Z may be arranged in the fourth position region A4.

As described above, if the side end 47S of the anisotropic conductive layer 47 is arranged in the third position region A3, the side surface 45, the chamfer 49, or the side wiring 46 of the substrate 40 may be damaged. In order to prevent the damage, the side end 47S of the anisotropic conductive layer 47 may be arranged in the fourth position region A4.

Accordingly, the side end 47S of the anisotropic conductive layer 47 may be arranged inside the side end 75 of the front cover 70 or the side end 91 of the side cover 90 and thus the side end 47S of the anisotropic conductive layer 47 may not be exposed to the outside of the display module 30 and covered by the side cover 90. Therefore, it is possible to reduce the visibility of the seam and to prevent the introduction of the high-voltage current caused by the electrostatic discharge.

The side cover 90 may not only cover the outside of the side surface 45 of the substrate 40 in the third direction Z, but also cover all the outside of the side surface 45 in the second direction Y, as illustrated in FIG. 10.

That is, as described above, the side cover 90 may be provided to surround all four edges E of the substrate 40.

Accordingly, the mounting surface 41, which is the front surface of the substrate 40, may be covered by the front cover 70, the rear surface 43 of the substrate 40 may be covered by the metal plate 60, and the side surface 45 and the chamfer 49 of the substrate 40 may be covered by the side cover 90.

Particularly, the side cover 90 may be provided to extend from the upper portion of the metal plate 60 to the lower surface 76 of the front cover 70 in the first direction X, thereby completely sealing the substrate 40 from the outside.

The front cover 70 may be formed of a non-conductive material through which electric charges do not flow.

The side cover 90 may be formed of a non-conductive material through which electric charges do not flow.

The front cover 70 and the side cover 90 may be formed of a non-conductive material, and thus most of the current applied to the front cover 70 or the side cover 90 may flow on the front cover 70 and the side cover 90 without passing through the front cover 70 and the side cover 90.

In addition, the metal plate 60 may be formed of a material having a large capacitance to serve as a ground configuration. Accordingly, in response to a current applied to the metal plate 60, the potential of the metal plate 60 may be maintained at a constant potential and thus the current flowing into the metal plate 60 may be absorbed by the metal plate 60, and the current may not flow to the substrate 40 through the metal plate 60.

Particularly, in the conventional manner, the side wiring or the anisotropic conductive layer 47 extending along the side surface of the substrate is exposed to the outside, and thus the current flows into the side wiring caused by the electrostatic discharge, thereby causing the damage of the electrical component arranged on the substrate.

In the display apparatus 1 according to an embodiment of the disclosure, all of the side wiring 46 of the substrate 40 may be covered by the side cover 90, and thus the side wiring 46 may be sealed and may not be exposed to the outside. Therefore, even when the electrostatic discharge occurs on the side surface 45 of the substrate 40, the side cover 90 may prevent the current from flowing into the side wiring 46.

The side cover 90 may be formed of a non-conductive material, and may additionally be formed of a material mixed with an antistatic agent.

Accordingly, the side end 47S of the anisotropic conductive layer 47 covered from the outside by the side cover 90 may be provided to prevent the introduction of the current.

Particularly, as shown in FIG. 10, electrostatic discharge E2 may not easily occur on the side cover 90, and even when a current e2 is generated by the electrostatic discharge E2, an amount of the current e2 may be a relatively small amount. The generated current e2 may flow on the side cover 90 and flow to the metal plate 60 provided in contact with the side cover 90.

In response to a current e1 generated by electrostatic discharge E1 on the front cover 70, the current e1 may not pass through the front cover 70, and thus the current e1 may not flow into the substrate 40. Therefore, the current may flow on the front cover 70 and then flow to the side cover 90.

The current e1 flowing into the side cover 90 may not pass through the side cover 90 and thus may not flow into the substrate 40. Therefore, the current e1 may flow on the side cover 90 and then flow to the metal plate 60 in contact with the side cover 90.

That is, the side end 91 of the side cover 90 may provide a path on which the current flows to the metal plate 60.

Accordingly, the display module 30 may be provided to be sealed from the outside by the front cover 70 and the side cover 90 even when the side end 47S of the anisotropic conductive layer 47 is arranged outside the substrate 40. The metal plate 60 arranged on the rear surface 43 of the substrate 40 may be formed in a ground configuration and thus even when a current caused by the electrostatic discharge is generated on the front cover 70 or the side cover 90, the current may flow to the metal plate 60 along the side end 91 of the side cover 90, and thus ESD withstand voltage of the electrical components mounted on the substrate 40 may be improved.

Hereinafter a method of manufacturing the display module 30 according to an embodiment of the disclosure will be briefly described.

Figure 11:
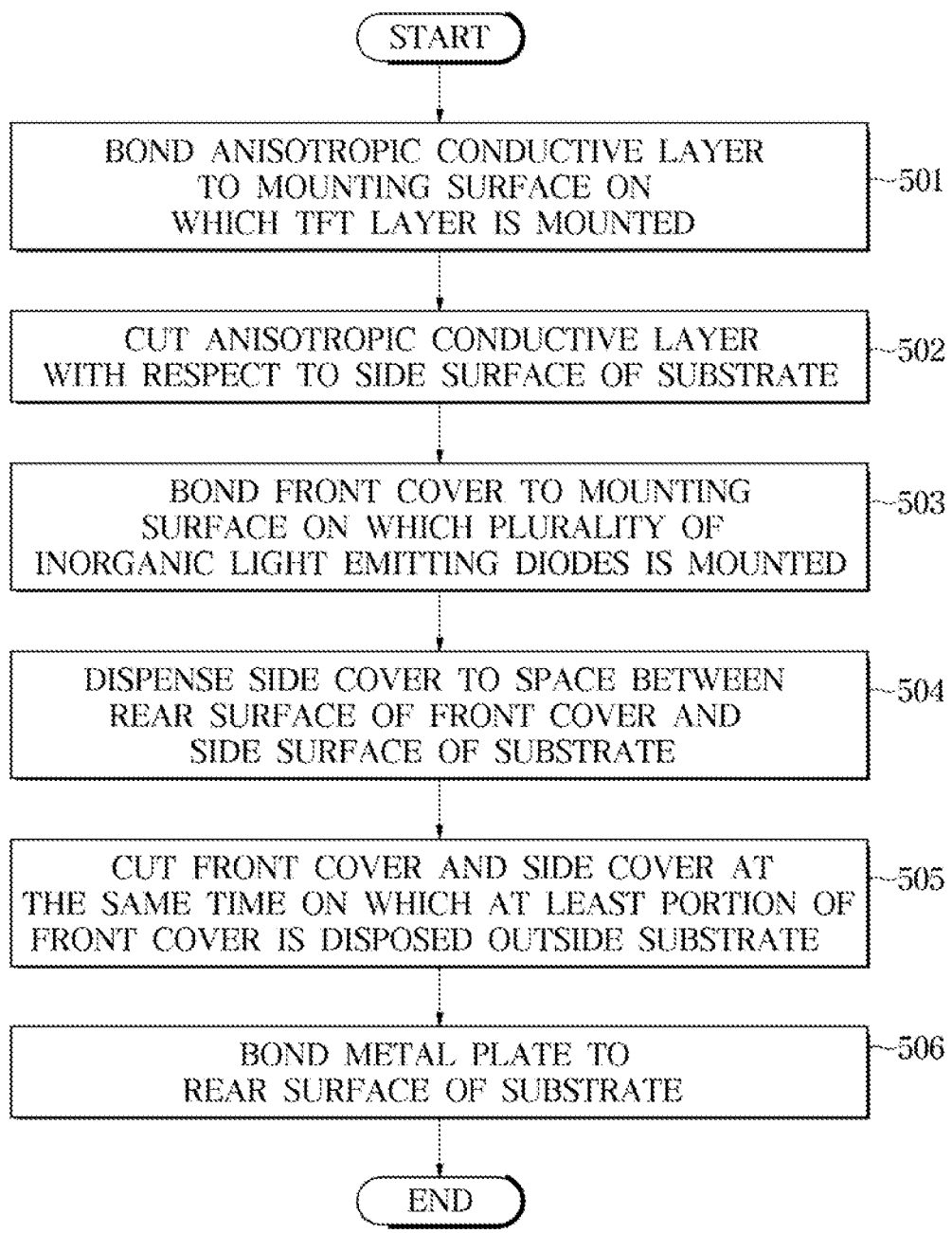
FIG. 11 is a flowchart illustrating a manufacturing method of the display apparatus according to an embodiment of the disclosure.
Figure 12:
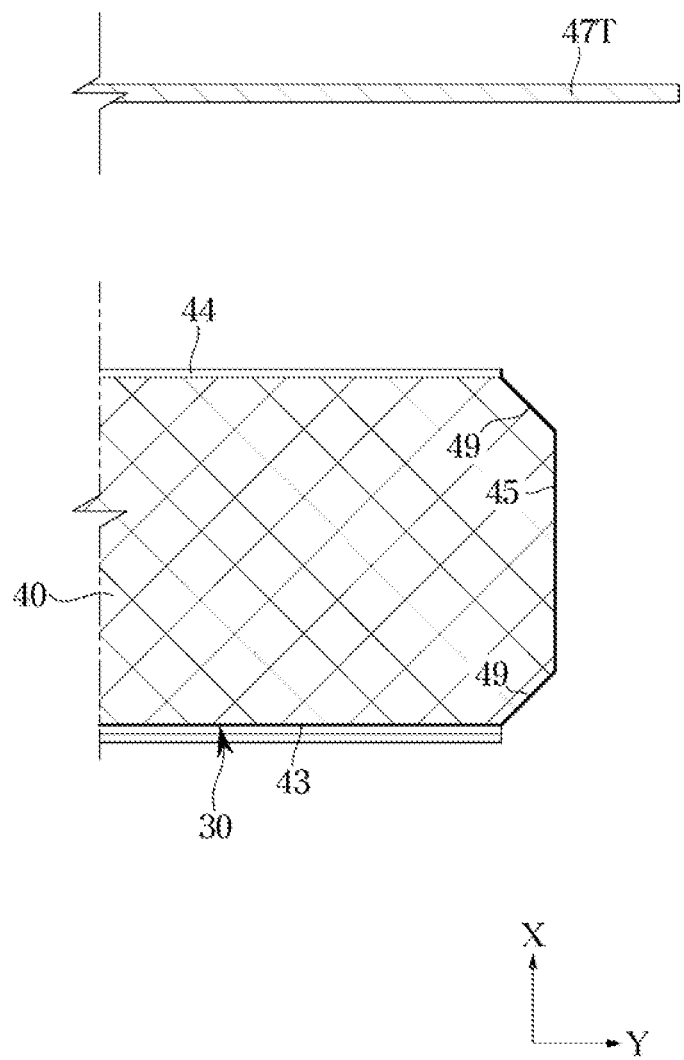
FIG. 12 is a view illustrating a manufacturing process of the display apparatus according to an embodiment of the disclosure.
Figure 13:
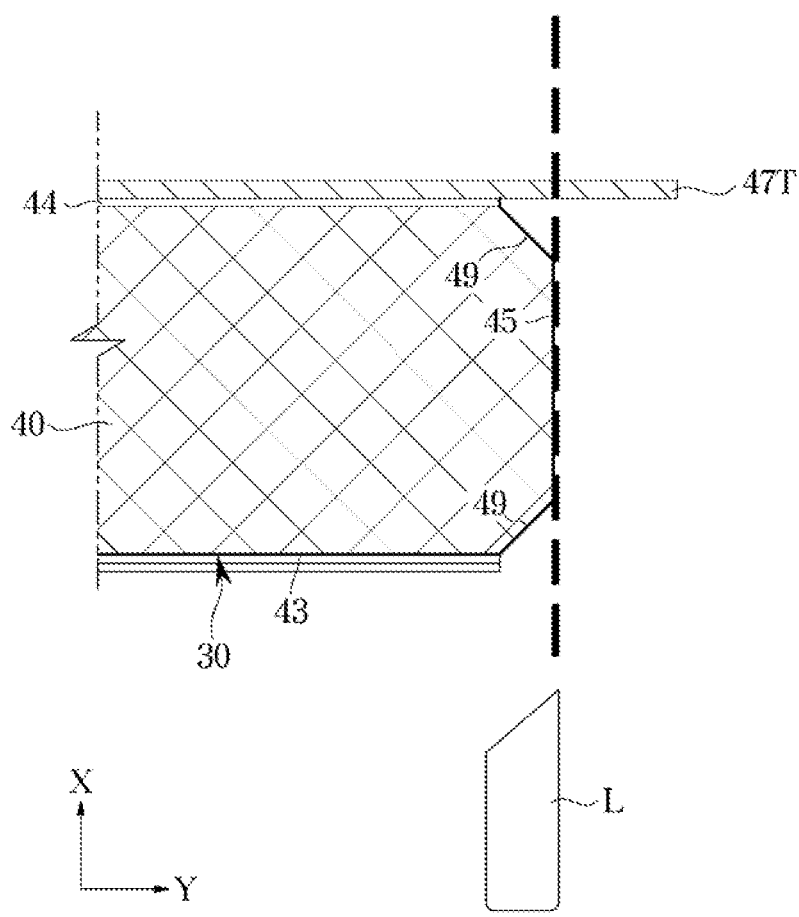
FIG. 13 is a view illustrating a manufacturing process of the display apparatus after FIG. 12.
Figure 14:
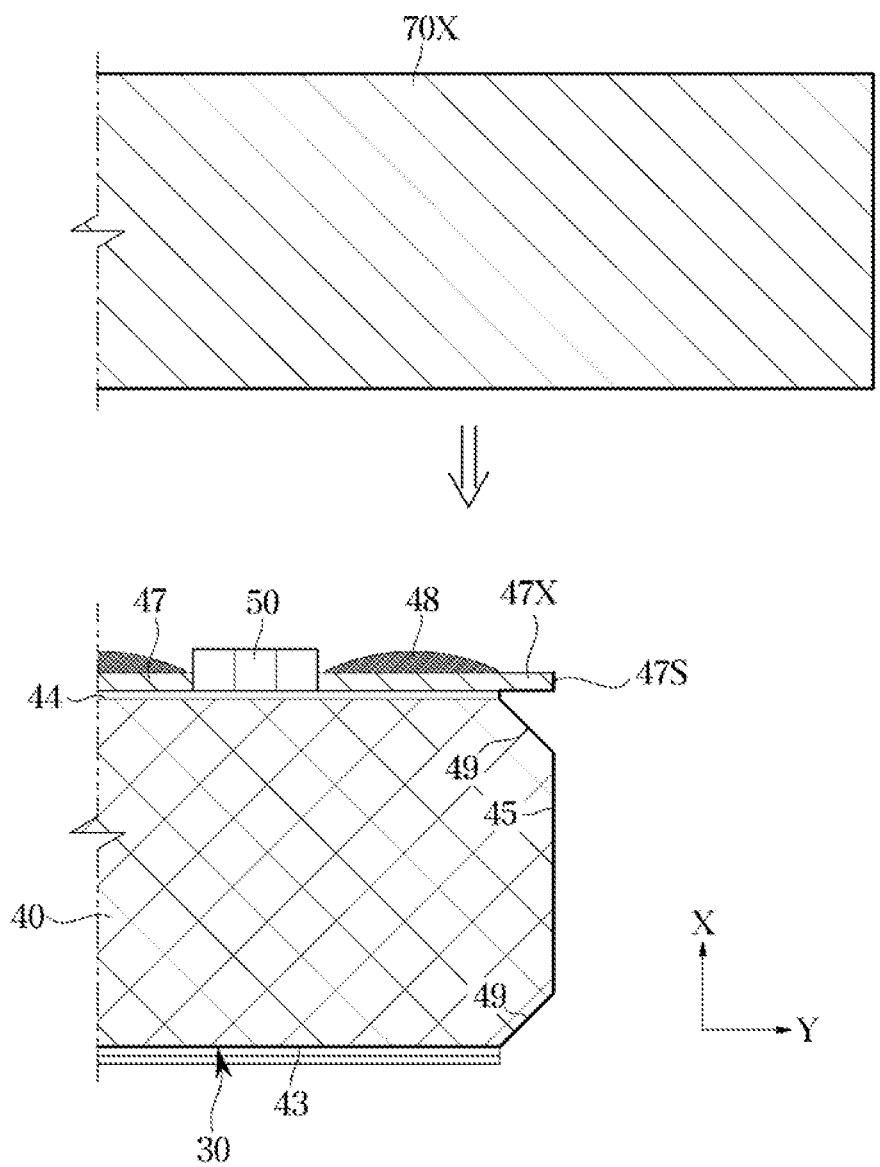
FIG. 14 is a view illustrating a manufacturing process of the display apparatus after FIG. 13 of the disclosure.
Figure 15:
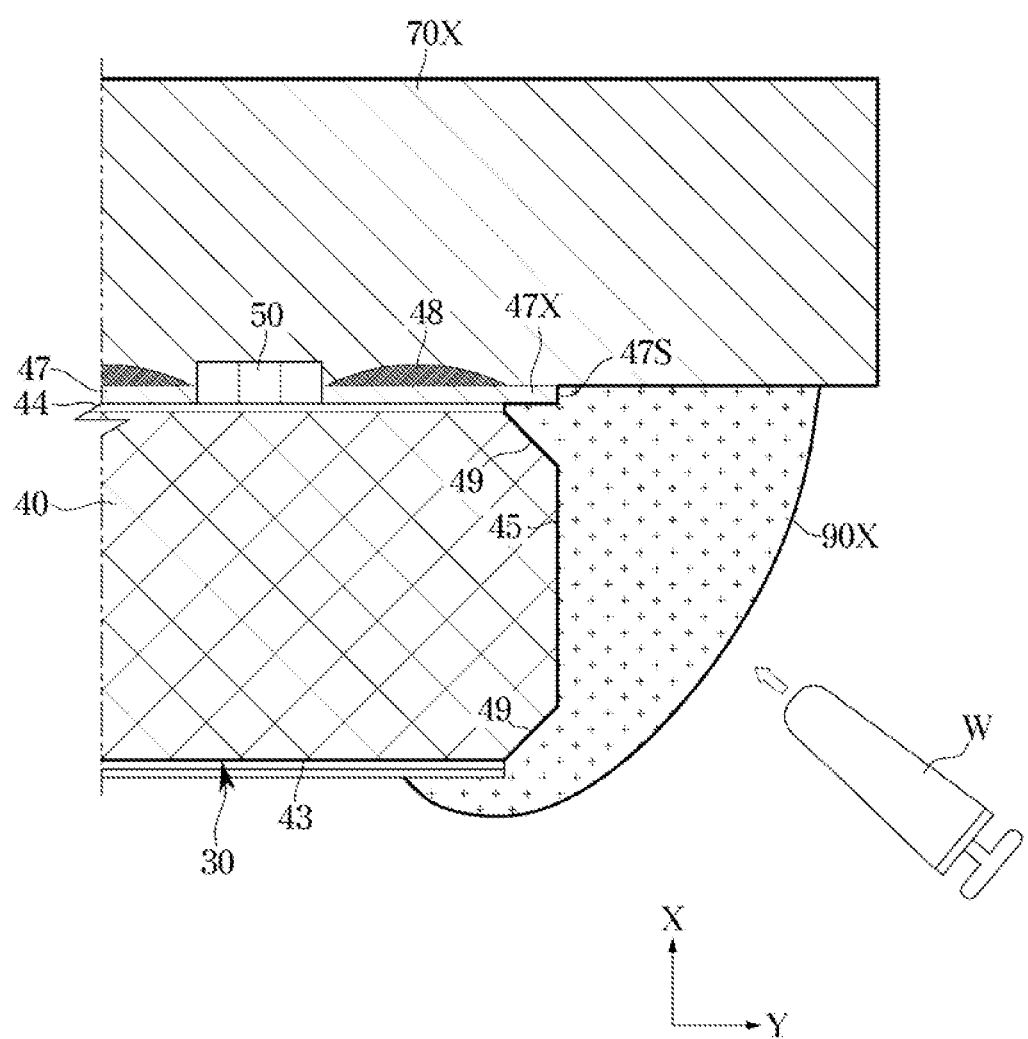
FIG. 15 is a view illustrating a manufacturing process of the display apparatus after FIG. 14 of the disclosure.
Figure 16:
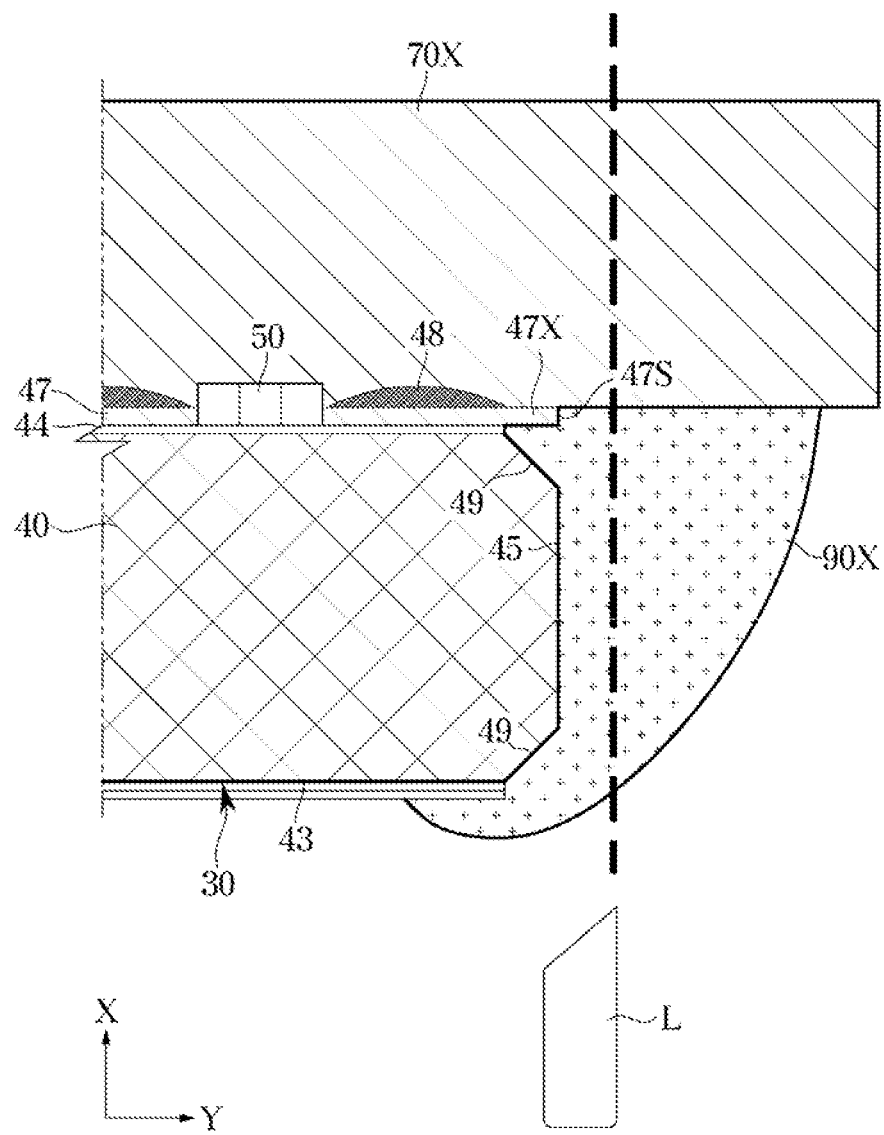
FIG. 16 is a view illustrating a manufacturing process of the display apparatus after FIG. 15 of the disclosure.
Figure 17:
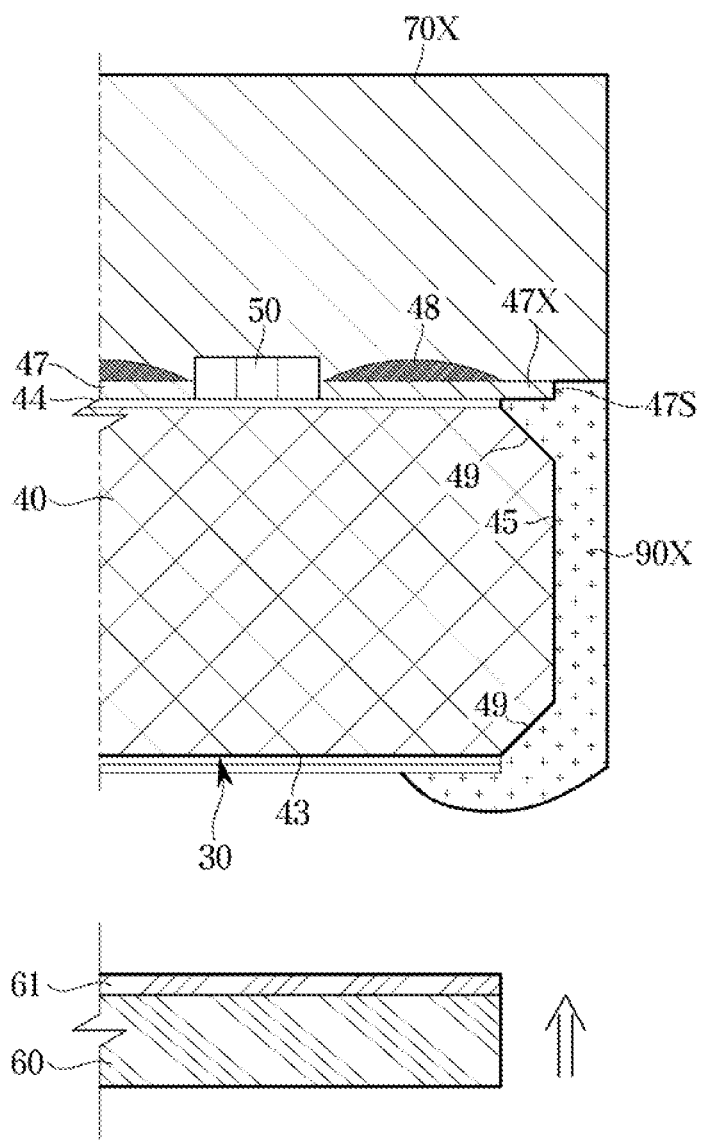
FIG. 17 is a view illustrating a manufacturing process of the display apparatus after FIG. 16 of the disclosure.

FIG. 11 is a flowchart illustrating a manufacturing method of the display apparatus according to an embodiment of the disclosure, FIG. 12 is a view illustrating a manufacturing process of the display apparatus according to an embodiment of the disclosure, FIG. 13 is a view illustrating a manufacturing process of the display apparatus after FIG. 12, FIG. 14 is a view illustrating a manufacturing process of the display apparatus after FIG. 13 of the disclosure, FIG. 15 is a view illustrating a manufacturing process of the display apparatus after FIG. 14 of the disclosure, FIG. 16 is a view illustrating a manufacturing process of the display apparatus after FIG. 15 of the disclosure, and FIG. 17 is a view illustrating a manufacturing process of the display apparatus after FIG. 16 of the disclosure.

As shown in FIG. 12, the substrate 40 in which the TFT layer 44 is formed on the mounting surface 41 is prepared, and an anisotropic conductive film 47T is bonded to the TFT layer 44 (501).

As shown in FIG. 13, the anisotropic conductive film 47T bonded to the substrate 40 is cut in the second direction Y with respect to the side surface 45 and cut in the third direction Z with respect to the side end 46S of the side wiring 46 (502).

The cutting process may be performed by laser L cutting or the like. Accordingly, the anisotropic conductive film 47T may be formed as the anisotropic conductive layer 47 bonded to the substrate 40.

It is appropriate that the side end 47S of the anisotropic conductive layer 47 is arranged on the same line as the side surface 45 with respect to the second direction Y and arranged on the same line as the side end 46S of the side wiring 46 with respect to the third direction Z.

However, in consideration of the possibility that the side surface 45 and the side wiring 46 are damaged, the side end 47S of the anisotropic conductive layer 47 may be arranged on the outside of the side surface 45 with respect to the second direction Y and arranged on the outside of the side end 46S of the side wiring 46 with respect to the third direction Z.

As shown in FIG. 14, the display module 30, in which the plurality of inorganic light emitting diodes 50 and the electrical components forming the display module 30 are mounted on the anisotropic conductive layer 47, is prepared and a front cover 70X is bonded to the mounting surface 41 of the display module 30 (503).

The front cover 70X means the front cover 70X before being cut. The front cover 70X may be provided to cover the entire area of the mounting surface 41. The front cover 70X may be formed through a compression curing process on the mounting surface 41.

As shown in FIG. 15, a side cover 90X is dispensed to a space between the chamfer 49 formed between the rear surface of the front cover 70X and the side surface 45 of the substrate 40 in the first direction X (504).

The side cover 90X means the side cover 90X before being cut together with the front cover 70X.

A predetermined amount may be applied as the side cover 90X by a dispenser W. The side cover 90X that is applied may be cured through subsequent operations. For example, the side cover 90X may be formed of non-conductive black resin.

The side cover 90X may be applied to cover all the chamfer 49 formed between the rear surface of the front cover 70X and the side surface 45, and the mounting surface 41 and the side surface 45 of the substrate 40, and the chamfer 49 formed between the side surface 45 and the rear surface 43.

In addition, in the anisotropic conductive layer 47, the region 47X arranged outside the mounting surface 41 may also be covered by the applied side cover 90X.

The dispensing operation of the side cover 90X may be performed on all four edges E of the substrate 40. Accordingly, the side cover 90X may be dispensed to cover all the side surfaces 45 of the substrate 40. In addition, in the anisotropic conductive layer 47, the entire region 47X arranged outside the mounting surface 41 may be covered by the side cover 90X.

While the side cover 90X is cured, the side cover 90X may be bonded to the chamfer 49 formed between the rear surface of the front cover 70X and the side surface 45 of the substrate 40, and the mounting surface 41 and the side surface 45, and bonded to the region 47X, which is arranged on the outside of the mounting surface 41, in the anisotropic conductive layer 47.

Based on the side cover 90X including a photosensitive material, the side cover 90X may be colored in a dark color by emitting ultraviolet rays (UX) or the like as a subsequent operation. However, based on the side cover 90X being formed of a translucent or opaque material without including a photosensitive material, such a manufacturing process is not required.

As shown in FIG. 16, the front cover 70X and the side cover 90X are cut in the first direction X so as to allow at least a portion of the front cover 70X to extend to the outside of the substrate 40 in the second direction Y that is perpendicular to the first direction X to which the mounting surface 41 faces (505).

The cutting process may be performed by laser L cutting or the like. Accordingly, the front cover 70X and the side cover 90X may be simultaneously cut.

In the cutting process, the front cover 70X and the side cover 90X may be cut to allow the front cover 70X to include the first region 71 in the third direction Z, which is perpendicular to the first direction X and the second direction Y, as well as the second direction Y and to allow the side cover 90X to be arranged in the second direction Y and the third direction Z.

That is, the cutting process may be performed on all four edges E of the substrate 40.

The cutting process may be performed to allow a cutting position of the front cover 70X and the side cover 90X to be on the outer side with respect to the side end 47X of the anisotropic conductive layer 47.

This is because if the cutting position of the front cover 70X and the side cover 90X is on the inner side with respect to the side end 47X of the anisotropic conductive layer 47, the anisotropic conductive layer 47 may be exposed to the outside of the side cover 90.

As illustrated in FIG. 16, the side end 75 of the front cover 70 and the side end 91 of the side cover 90 may be formed on the same line in the first direction X by the cutting process. It is appropriate that the side end 75 of the front cover 70 and the side end 91 of the side cover 90 may be cut to be formed in a direction parallel to the first direction X.

The process may be performed to allow a length of the first region 71, which extends to the outside of the mounting surface 41, to be approximately less than or equal to half of a length of the gap G formed between the plurality of display modules 30A-30P in the state in which the display module 30 is provided as the plurality of display modules 30A-30P.

As shown in FIG. 17, the metal plate 60 is bonded to the rear surface 43 of the substrate 40 (506).

The rear adhesive tape 61 may be arranged on the upper surface of the metal plate 60 in the first direction X, and thus in response to compressing the rear adhesive tape 61 and the rear surface 43 of the substrate 40, the rear adhesive tape 61 may bond the substrate 40 to the metal plate 60.

However, the disclosure is not limited thereto, and the rear adhesive tape 61 may be arranged on the rear surface 43 of the substrate 40, and the metal plate 60 may be compressed against the rear adhesive tape 61 arranged on the rear surface 43.

In this case, a portion of the side cover 90X dispensed on the rear surface 43 of the substrate 40 remains, but this is a relatively small portion that may be negligible. Therefore, the metal plate 60 and the rear surface 43 of the substrate 40 may be bonded to each other approximately horizontally.

The display module 30, which is processed through the above-mentioned processing, may be prepared as the plurality of display modules 30A-30P, and the plurality of display modules 30A-30P may be arranged adjacent to each other. In this case, the plurality of display modules 30A-30P may be fixed through a jig. The plurality of display modules 30A-30P may be arranged in an M*N matrix.

Hereinafter a display apparatus 1 according to an embodiment of the disclosure will be described. Configurations other than a side end cover 100 to be described below are the same as those of the display apparatus 1 according to an embodiment of the disclosure described above, and thus overlapping descriptions will be omitted.

Figure 18:
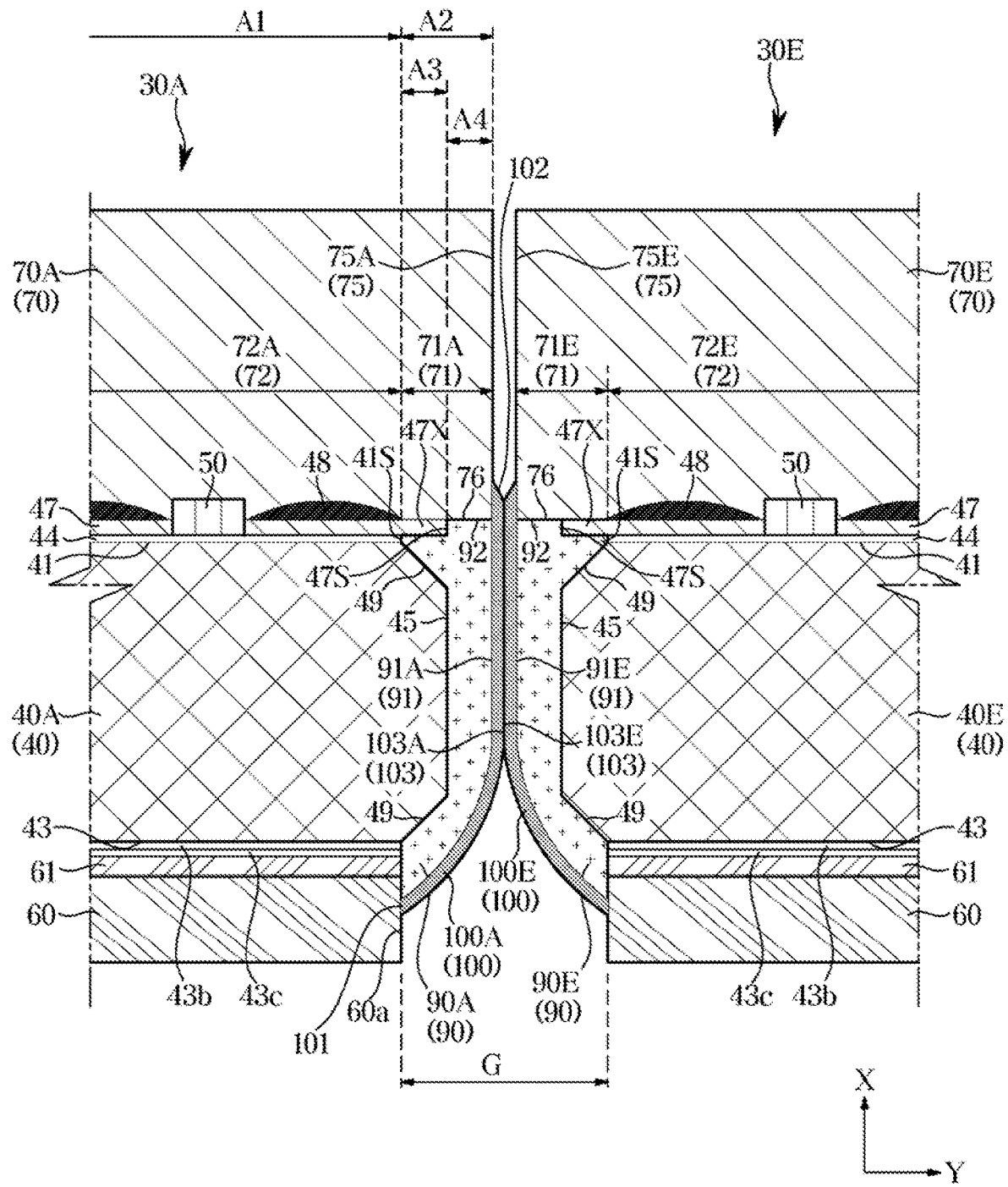
FIG. 18 is an enlarged cross-sectional view illustrating a part of a configuration of a display apparatus according to another embodiment of the disclosure, with respect to the second direction.
Figure 19:
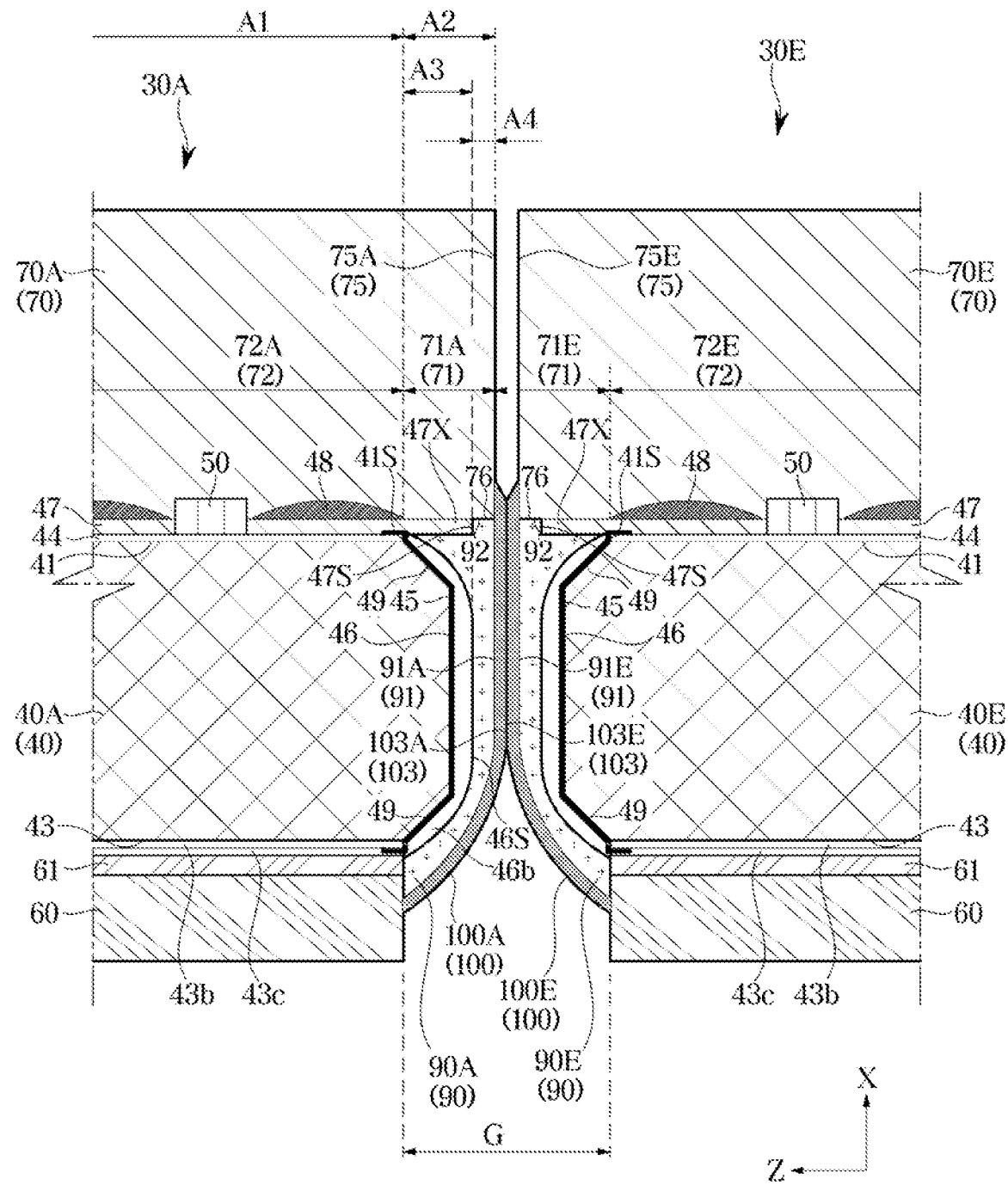
FIG. 19 is an enlarged cross-sectional view illustrating a part of a configuration of a display apparatus according to another embodiment of the disclosure, with respect to the third direction.
Figure 20:
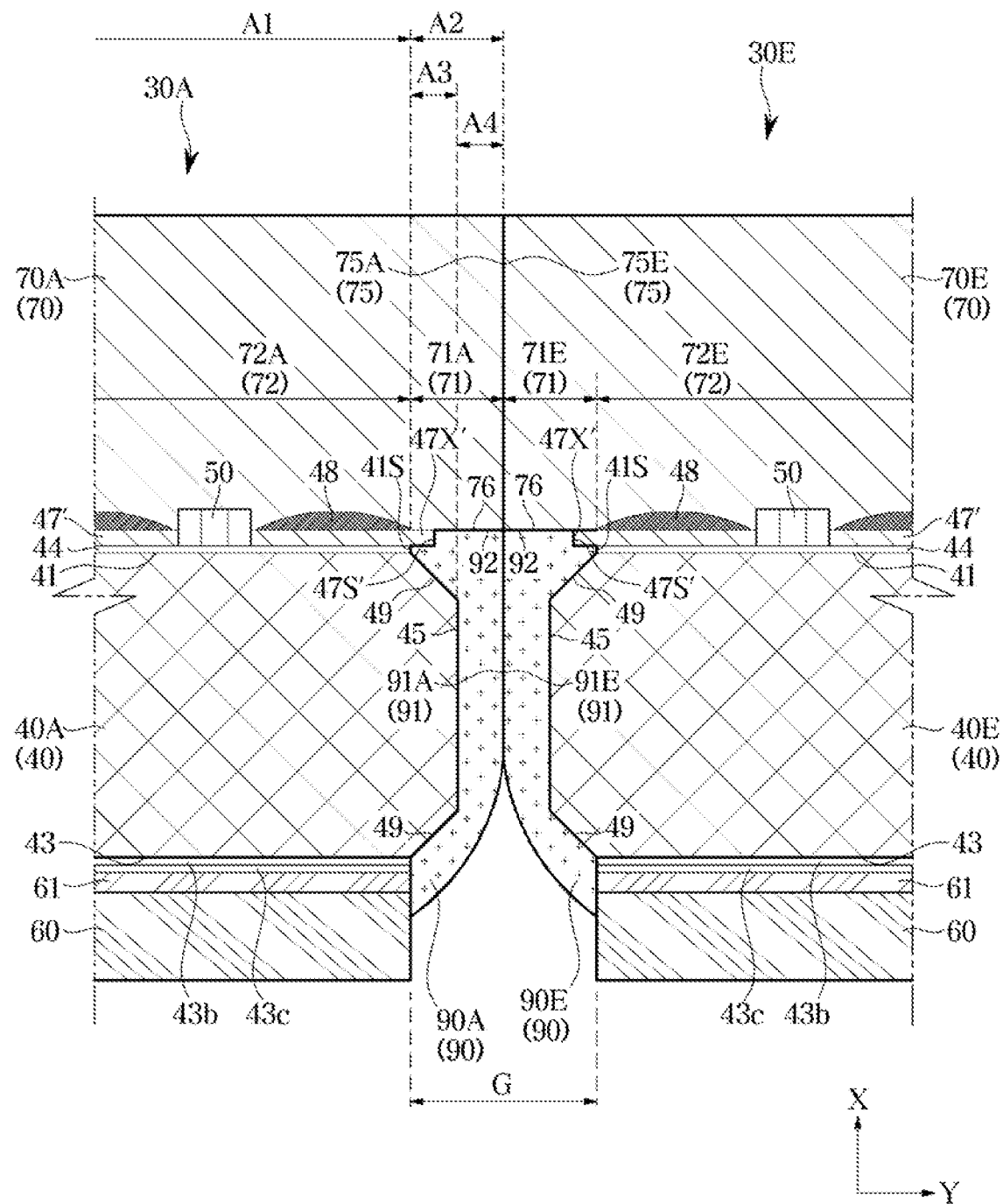
FIG. 20 is an enlarged cross-sectional view illustrating a part of a configuration of a display apparatus according to another embodiment of the disclosure, with respect to the second direction.

FIG. 18 is an enlarged cross-sectional view illustrating a part of a configuration of a display apparatus according to another embodiment of the disclosure, with respect to the second direction, FIG. 19 is an enlarged cross-sectional view illustrating a part of a configuration of a display apparatus according to another embodiment of the disclosure, with respect to the third direction, and FIG. 20 is an enlarged cross-sectional view illustrating a part of a configuration of a display apparatus according to another embodiment of the disclosure, with respect to the second direction.

In the process of the display apparatus for implementing the display panel with the display module, the plurality of display modules may be tiled to form the display panel.

In this case, in a production line, in which each display module is manufactured and transported, during the process of forming the display panel with the display module, the current generated by the electrostatic discharge may flow into the inside of the display module and the electrical components mounted inside the display module may be damaged.

Even before the display module is coupled to the frame 15 and assembled as the display apparatus 1, it is required for each display module to include a component configured to absorb an electric shock so as to prevent the current, which is generated by the electrostatic discharge, from flowing into the inside of the display module, and to prevent the electrical components mounted inside the display module from being damaged.

That is, each of the display modules 30A-30P may independently include a component configured to prevent the current, which is generated by the electrostatic discharge, from flowing into a configuration mounted to the substrate 40, and include a component configured to allow the current, which is generated by the electrostatic discharge, to be easily guided to the ground configuration on each of the display modules 30A-30P without flowing into the configuration mounted to the substrate 40.

Each of the display modules 30A-30P of the display apparatus 1 according to an embodiment of the disclosure described above may include the side cover 90 provided to extend from the upper portion of the metal plate 60 in the first direction X, to which the mounting surface 41 faces, to the lower surface 76 of the first region 71, which is arranged on the outer side than the mounting surface 41, in the front cover 70 so as to seal the side surface 45 from the outside.

In addition, each of display modules 30A-30P of the display apparatus 1 according to an embodiment of the disclosure may additionally include the side end member 100 arranged at the outer end of the side cover 90 in the second direction Y and the third direction Z and formed of a material having higher conductivity than the side cover 90.

Each of the display modules 30A-30P is the same. Hereinafter the first display module 30A will be described as a representative.

As shown in FIGS. 18 and 19, the side end member 100 may not only cover the outside of the side surface 45 of the substrate 40 in the third direction Z, but also cover all the side surface 45 in the second direction Y.

That is, the side end member 100 may be provided to surround all four edges E of the substrate 40.

It is appropriate that the side end member 100 is formed of a metal material, and formed of a material having higher conductivity than the side cover 90. The side end member 100 may be coated on the side cover 90 to be arranged on the outer end of the side cover 90.

The side end member 100 may be provided to be in contact with the metal plate 60 in the first direction X. That is, one end 101 of the side end member 100 in the first direction X may be provided to be in contact with the metal plate 60.

It is appropriate that the one end 101 of the side end member 100 is provided to be in contact with a side surface 60a of the metal plate 60 in the second direction Y or the third direction Z.

The side end member 100 may be provided to be in contact with the front cover 70 in the first direction X. That is, the other end 102 of the side end member 100 in the first direction X may be provided to be in contact with the front cover 70.

It is appropriate that the other end 102 of the side end member 100 is provided to be in contact with the side end 75 of the front cover 70 in the second direction Y or the third direction Z.

The other end 102 of the side end member 100 in the first direction X may be arranged above the lower surface 76 of the front cover 70.

The one end 101 of the side end member 100 in the first direction X may be arranged below the lower surface 76 of the front cover 70.

Accordingly, the side end member 100 may be provided to surround the entire side cover 90 corresponding to the four edges E of the substrate 40 and may be provided to prevent the side cover 90 from being exposed to the outside.

As described above, the side end member 100 may be formed of a material having higher conductivity than the side cover 90.

Further, the side end member 100 may be formed of a material having higher conductivity than the front cover 70.

That is, the display module 30 may be provided to be sealed from the outside by the front cover 70, the side cover 90, and the side end member 100, so as to physically and electrically protect the electrical components forming the display module 30.

Hereinafter a display module 30 according to an embodiment of the disclosure will be described. Configurations other than an anisotropic conductive layer 47' described below are the same as those of the display module 30 described above, and thus overlapping descriptions will be omitted.

FIG. 20 is an enlarged cross-sectional view illustrating a part of a configuration of a display apparatus according to another embodiment of the disclosure, with respect to the second direction.

Unlike the display apparatus 1 according to an embodiment of the disclosure described above, in the anisotropic conductive layer 47' of the display module 30 of the display apparatus 1 according to another embodiment of the disclosure, a region 47X' extending to a region outside the mounting surface 41 of the substrate 40 may be provided to be arranged in the third position region A3.

The anisotropic conductive layer 47' may be formed of an anisotropic conductive film. The anisotropic conductive film may be provided to be larger than the area of the mounting surface 41 of the substrate 40 and smaller than the entire area of the substrate 40.

Accordingly, in the process of the display module 30, it is possible to omit a process in which the anisotropic conductive film having an area less than that of the substrate 40 is bonded to the mounting surface 41 and the anisotropic conductive film is cut.

A side end 47X' of the anisotropic conductive layer 47' may be arranged in the third position region A3, and thus the side end 47X' of the anisotropic conductive layer 47' may be covered by the side cover 90.

As is apparent from the above description, a display apparatus may have a seamless effect in which a seam is not visually visible by absorbing light incident on a gap between adjacent display modules.

Further, as for a display apparatus, each of covers and substrates of display modules may individually include a component configured to absorb light that is incident on or reflected on a gap formed between adjacent display modules, and thus it is possible to more easily and efficiently implement the seamless effect even when a plurality of display modules is assembled to each other.

Further, as for a display apparatus, an anisotropic conductive layer arranged on a display module of a display apparatus may be prevented from being arranged outside the display module, thereby preventing recognition of a seam that may be generated by the anisotropic conductive layer, and thereby preventing a current from flowing from the outside through the anisotropic conductive layer. The display apparatus may prevent the display module from being damaged caused by electrostatic discharge.

Although a few embodiments of the disclosure have been shown and described, it would be appreciated by those skilled in the art that changes may be made in these embodiments without departing from the principles and spirit of the disclosure, the scope of which is defined in the claims and their equivalents.

What is claimed is:

1. A display module comprising:
    a substrate comprising a mounting surface and a side surface;
    a Thin Film Transistor (TFT) layer provided on the mounting surface of the substrate;
    a plurality of inorganic light emitting diodes mounted on the mounting surface of the substrate;
    an anisotropic conductive layer provided on an upper surface of the TFT layer and electrically connecting the TFT layer to the plurality of inorganic light emitting diodes;
    a front cover covering the mounting surface; and
    a side cover surrounding the side surface,
    wherein a side end of the front cover extends to a region outside the mounting surface,
    wherein the side cover is bonded to a lower surface of the front cover and to the side surface of the substrate which correspond to the region outside of the mounting surface, and
    wherein a side end of the anisotropic conductive layer is provided in the region outside the mounting surface and on an inner side with respect to the side end of the front cover.

2. The display module of claim 1, wherein the side end of the front cover and a side end of the side cover are coplanar.

3. The display module of claim 1, wherein the side end of the anisotropic conductive layer is between the side surface of the substrate and the side end of the front cover.

4. The display module of claim 1, wherein the side end of the anisotropic conductive layer is provided on an inner side with respect to the side surface of the substrate.

5. The display module of claim 1, wherein the substrate further comprises a side wiring extending along the side surface of the substrate and electrically connected to the TFT layer,
    wherein the side end of the anisotropic conductive layer is provided between a side end of the side wiring of the substrate and the side end of the front cover.

6. The display module of claim 1, wherein the side cover comprises a non-conductive material.

7. The display module of claim 1, wherein the side cover comprises a material that absorbs light.

8. The display module of claim 1, wherein the side surface of the substrate is positioned corresponding to four edges of the mounting surface;
the front cover extends to a region outside the four edges of the mounting surface; and
the side cover contacts an entirety of the lower surface of the front cover, which corresponds to the region outside of the mounting surface, and surrounds the side surface of the substrate along the four edges of the mounting surface.

9. A display module comprising:
a substrate comprising a mounting surface and a side surface;
a Thin Film Transistor (TFT) layer provided on the mounting surface of the substrate;
a plurality of inorganic light emitting diodes mounted on the mounting surface of the substrate;
an anisotropic conductive layer provided on an upper surface of the TFT layer and electrically connecting the TFT layer to the plurality of inorganic light emitting diodes;
a front cover covering the mounting surface;
a side cover surrounding the side surface; and
a side end member provided at a side end of the side cover, the side end member comprising a material having higher conductivity than a conductivity of the side cover,
wherein a side end of the front cover extends to a region outside the mounting surface,
wherein the side cover is bonded to a lower surface of the front cover and to the side surface of the substrate which correspond to the region outside of the mounting surface, and
wherein a side end of the anisotropic conductive layer is provided on an inner side with respect to the side end of the front cover.

10. The display module of claim 9, further comprising:
a metal plate bonded to a rear surface of the substrate and provided on a side of the substrate that is opposite to the mounting surface.

11. The display module of claim 9, wherein one end of the side end member contacts the front cover.

12. A display apparatus comprising:
a display module array comprising a plurality of display modules horizontally arranged in an M×N matrix,
wherein each of the plurality of display modules comprises:
a substrate comprising a mounting surface and a side surface;
a Thin Film Transistor (TFT) layer is provided on the mounting surface;
a plurality of inorganic light emitting diodes mounted on the mounting surface;
an anisotropic conductive layer provided on an upper surface of the TFT layer and electrically connecting the TFT layer to the plurality of inorganic light emitting diodes;
a front cover covering the mounting surface; and
a side cover surrounding the side surface, wherein a side end of the front cover extends to a region outside the mounting surface,
wherein the side cover is bonded to a lower surface of the front cover and to the side surface of the substrate which correspond to the region outside of the mounting surface, and
wherein a side end of the anisotropic conductive layer is provided in the region outside the mounting surface and on an inner side with respect to the side end of the front cover.

13. The display apparatus of claim 12, wherein the side end of the front cover and a side end of the side cover are coplanar.

14. The display apparatus of claim 12, wherein the side end of the anisotropic conductive layer is provided between the side surface of the substrate and the side end of the front cover.

15. A display apparatus comprising:
a display module array comprising a plurality of display modules horizontally arranged in an M×N matrix,
wherein each of the plurality of display modules comprises:
a substrate comprising a mounting surface and a side surface;
a Thin Film Transistor (TFT) layer is provided on the mounting surface;
a plurality of inorganic light emitting diodes mounted on the mounting surface;
an anisotropic conductive layer provided on an upper surface of the TFT layer and electrically connecting the TFT layer to the plurality of inorganic light emitting diodes;
a front cover covering the mounting surface;
a side cover surrounding the side surface;
a side end member provided at a side end of the side cover, the side end member comprising a material having higher conductivity than a conductivity of the side cover,
wherein a side end of the front cover extends to a region outside the mounting surface,
wherein the side cover is bonded to a lower surface of the front cover and to the side surface of the substrate which correspond to the region outside of the mounting surface, and
wherein a side end of the anisotropic conductive layer is provided on an inner side with respect to the side end of the front cover.

16. A display apparatus comprising a plurality of display modules, each of the plurality of display modules comprising:
a substrate;
an anisotropic conductive layer provided on a front surface of the substrate;
a plurality of inorganic light emitting diodes provided on the front surface of the substrate;
a front cover covering the front surface of the substrate and the plurality of inorganic light emitting diodes; and
a side cover surrounding side surfaces of the substrate and side surfaces of the anisotropic conductive layer,
wherein edges of the anisotropic conductive layer protrude from edges of the front surface of the substrate, and
wherein edges of the front cover protrude from the edges of the anisotropic conductive layer.

17. The display apparatus of claim 16, wherein the substrate comprises chamfered edges connecting the front surface of the substrate to the side surfaces of the substrate, and
wherein the side surfaces of the substrate protrude from the edges of the front surface.

* * * * *